United States Patent
Khan et al.

(10) Patent No.: US 11,657,889 B2
(45) Date of Patent: May 23, 2023

(54) ERROR CORRECTION FOR DYNAMIC DATA IN A MEMORY THAT IS ROW ADDRESSABLE AND COLUMN ADDRESSABLE

(71) Applicant: Intel Corporation, Santa Clara, CA (US)

(72) Inventors: Jawad B. Khan, Portland, OR (US); Richard L. Coulson, Portland, OR (US); Zion S. Kwok, Vancouver (CA); Ravi H. Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/827,235

(22) Filed: Mar. 23, 2020

(65) Prior Publication Data

US 2020/0219580 A1 Jul. 9, 2020

(51) Int. Cl.
| | | |
|---|---|---|
| *G11C 29/42* | (2006.01) | |
| *G11C 29/44* | (2006.01) | |
| *G11C 11/409* | (2006.01) | |
| *G11C 5/02* | (2006.01) | |
| *G11C 29/02* | (2006.01) | |
| *G11C 29/12* | (2006.01) | |

(52) U.S. Cl.
CPC .............. *G11C 29/42* (2013.01); *G11C 5/025* (2013.01); *G11C 11/409* (2013.01); *G11C 29/021* (2013.01); *G11C 29/44* (2013.01); *G11C 2029/1204* (2013.01)

(58) Field of Classification Search
None
See application file for complete search history.

(56) References Cited

U.S. PATENT DOCUMENTS

| | | | |
|---|---|---|---|
| 4,675,808 A | * | 6/1987 | Grinn ...................... G06F 12/02 365/230.02 |
| 11,057,060 B1 | * | 7/2021 | Luo ...................... G06F 11/1072 |
| 2003/0031072 A1 | * | 2/2003 | Louzoun ............... G11C 11/419 365/220 |
| 2004/0062107 A1 | * | 4/2004 | Komatsuzaki .......... G11C 11/22 365/202 |
| 2004/0117723 A1 | * | 6/2004 | Foss .................... H03M 13/095 714/E11.041 |

(Continued)

FOREIGN PATENT DOCUMENTS

WO 2018226278 A1 12/2018

OTHER PUBLICATIONS

Partial European Search Report for Patent Application No. 20214421.8, dated May 20, 2021, 13 pages.

(Continued)

*Primary Examiner* — Douglas King
(74) *Attorney, Agent, or Firm* — Compass IP Law PC

(57) ABSTRACT

Error correction values for a memory device include row error correction values and column error correction values for the same memory array. The memory device includes a memory array that is addressable in two spatial dimensions: a row dimension and a column dimension. The memory array is written as rows of data, and can be read as rows in the row dimension or read as columns in the column dimension. A data write triggers updates to row error correction values and to column error correction values.

17 Claims, 12 Drawing Sheets

(56) References Cited

U.S. PATENT DOCUMENTS

| | | | |
|---|---|---|---|
| 2012/0144271 A1* | 6/2012 | Cideciyan | G06F 11/1012 |
| | | | 714/771 |
| 2013/0051137 A1 | 2/2013 | Zeng | |
| 2016/0321184 A1 | 11/2016 | Bromberg et al. | |
| 2017/0161142 A1* | 6/2017 | Reed | G11C 11/4087 |
| 2018/0267851 A1* | 9/2018 | Kaynak | H03M 13/1125 |
| 2018/0330789 A1 | 11/2018 | Castro | |
| 2019/0146717 A1 | 5/2019 | Khan et al. | |
| 2019/0317857 A1* | 10/2019 | Khan | G06F 11/1012 |
| 2019/0334585 A1* | 10/2019 | Lee | H04B 7/0413 |
| 2021/0224267 A1* | 7/2021 | Dongaonkar | G06F 16/221 |
| 2021/0407564 A1* | 12/2021 | Dongaonkar | G11C 7/1006 |

OTHER PUBLICATIONS

Wood, Roger, "Shingled Magnetic Recording and Two-Dimensional Magnetic Recording" IEEE Magnetics Society Santa Clara Valley Chapter, Hitachi GST, San Jose, California, Oct. 19, 2010, 59 pages.

Extended European Search Report for Patent Application No. 202114421.8, dated Oct. 7, 2021, 12 pages.

\* cited by examiner

ERROR CORRECTION FOR DYNAMIC DATA IN A MEMORY THAT IS ROW ADDRESSABLE AND COLUMN ADDRESSABLE

FIELD

Descriptions are generally related to memory devices, and more particular descriptions are related to error correction for a row addressable and column addressable memory device.

BACKGROUND

Memory devices are traditionally accessed as rows of bits. The array of a memory device includes rows and columns of bits and is row addressable. Specific bits from the row are accessible with a column address, but columns across multiple rows are not traditionally accessible. Memory devices in development will be capable of column addressability as well as row addressability. With column addressability, the bits of a single column across multiple rows can be read.

Emerging memory devices include internal or on-die error correction. Such on-die error correction can be referred to as on-die or internal error checking and correction (ECC). Internal ECC allows a memory device to perform ECC on read data prior to sending it back to the host in response to a read request. When data is traditionally written and read as rows, the ECC data can be included for a row, and written with the row data.

Column addressable memory devices may benefit from ECC. It will be understood that for a row addressable and column addressable memory, changes to a row will change both the row ECC for the row written, as well as the column ECC for potentially many rows. The update of multiple column ECC values can result in write amplification, with multiple additional operations required for each row write. For this reason, column addressability with ECC has been thought to be limited to static data, or data that is readable but not writeable. Dynamic data, or data that can be changed by writing, has been limited to row error correction, which opens the possibility of many errors in column reads. The possibility of error limits the application of column reads to applications that can tolerate errors, such as certain artificial intelligence applications such as similarity search or collaborative filtering. Applications that cannot tolerate errors, such as column-oriented databases, would be excluded from use of the column read capability.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
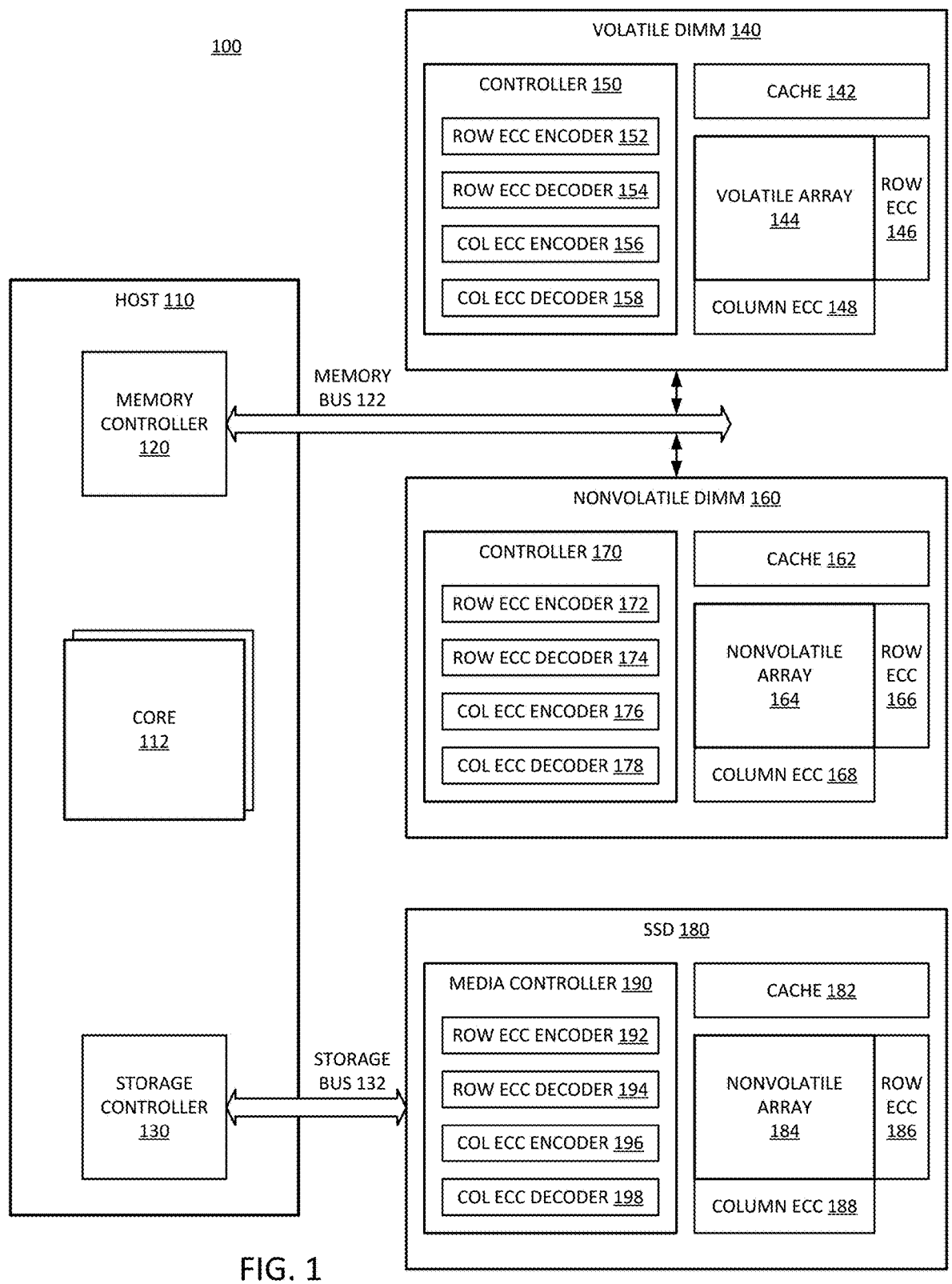
FIG. 1 is a block diagram of an example of a system with a memory device having row error correction for row reads and column error correction for column reads of dynamic data.

Descriptions of certain details and implementations follow, including non-limiting descriptions of the figures, which may depict some or all examples, and well as other potential implementations.

DETAILED DESCRIPTION

As described herein, a system maintains error correction data for dynamic data of a memory device, including row error correction data and column error correction data. The memory device includes a memory array that is addressable in two spatial dimensions: a row dimension and a column dimension. Thus, the error correction can be said to be two-dimensional error correction data, where the two dimensions are spatial dimensions rather than logical dimensions.

In general, error correction data or an error correction value refers to a group of bits to be used in error correction or error checking and correction (ECC). An ECC value or error correction value for row ECC can be referred to as row ECC or row-oriented check bits or parity bits. An ECC value or error correction value for column ECC can be referred to as column ECC or column-oriented check bits or parity bits. The value to be checked can be referred to as the codeword, which refers to a group of bits to be read and checked/corrected by decoding a row or column and its corresponding ECC bits. The codeword can be a row-oriented codeword for a row read. The codeword can be a column-oriented codeword for a column read.

One way to maintain row and column codewords up to date is to re-write all column ECC bits when a row is written. It will be understood that such an approach is impractical due to write amplification. Consider a nonvolatile crosspoint memory device, such as a three-dimensional crosspoint (3DXP) memory device that is row addressable and write addressable as an example. Specific examples include an OPTANE memory available from INTEL CORPORATION or QUANTX memory available from MICRON TECHNOLOGY, INC. Assume that the memory device has hundreds of extra bits for internal ECC. In such a case, a write of a row would cause 1 write for the intended or target row, and X row writes to update the column ECC. Thus, 1 row write becomes 1+X row writes, where X can be a value in the hundreds. Such an approach results in a degradation of more than 100× in performance, power, and endurance of the memory, which makes it impractical.

There are many types of computer operations (such as artificial intelligence (AI) applications, similarity search applications, collaborative filtering, column-oriented database operations, or others) that have algorithmic speed-ups possible with the possibility of a column read. The ability to have a practical application of column ECC can make speed up of such operations possible. As described herein, the system can maintain ECC on both row codewords and column codewords at the same time, even when data is overwritten.

For a memory array that is column addressable for reads as well as row addressable for reads, it will be understood that a write or update to data in the memory array will change both spatial dimensions at the same time. For example, if a row oriented codeword is written, the changes to the bits in the row oriented codeword will also change bits in column oriented codewords. If a column is read with error correction, the decode operation of the column and column ECC will view a bit changed by the row write to be an error and will "correct" it to its previous value, corrupting it.

Thus, the system maintains column ECC values and row ECC values when data is written. For example, the write of a row will update not only the row and potentially require a change to the error correction data for that row, but the error correction data for any column where a bit is changed will also become outdated at the same time. Thus, a row write not only triggers a computation of the row error correction data, but could trigger computations to update error correction data for multiple columns.

In one example, the memory device maintains row and column ECC with a "column ECC update" approach. In one example, the memory device maintains row and column ECC with a "column ECC cache" approach. In one example, the memory device maintains row and column ECC with a "column ECC update" approach. Each approach will be described in turn. The different approaches have different associated implementation costs as well as power, performance, and endurance implications on the system.

In one implementation, the column ECC update approach updates the column ECC values for columns having a corresponding bit in the row that is changed by the row write. For columns not changed by the row write, the column ECC is not changed. Such an approach has a performance impact even if only the changed columns are updated. Thus, such an algorithm may be practical only for workloads in which few bits are changed. It will be understood that "few" is a relative term, but can be understood in one example to refer to changes in the single digit number of bits. When the number of bits changed is in double digits, the performance degradation becomes double digits as well (e.g., at least 10× degradation).

For a general case where a row write can be expected to change many bits, either of the two approaches with a cache can provide significantly improved performance over the column ECC update approach. Both approaches require more hardware resources.

The column ECC cache approach refers to the use of a cache memory, such as static random-access memory (SRAM), to store a copy of the column ECC data or column ECC values. With the copy of the column ECC data in cache, the system does not write the column ECC bits to the row addressable and column addressable memory with each row update or row write. In one example, the cache is large enough to hold all column ECC data. In one example, the cache holds only a portion of the column ECC data. In such a case, the system can flush the cache to the row addressable and column addressable memory media or memory array when the cache is full.

With the column ECC cache approach, row writes and the storage of row ECC can occur as normal. Likewise, a row read occurs from the memory array as normal. A column read includes reading the column data from the memory array and checking the column ECC cache for column ECC data. For column ECC data stored in the cache, the application of ECC for the column read comes from the cached ECC value.

The row write cache approach refers to the use of a cache memory to cache some of the most-recently-written rows. Caching the rows allows the system to delay writing the rows, which will also delay the need to update the column ECC values changed in response to bits changed by the row write. When the cache is to be flushed to the memory array, the system can also update the column ECC values. The caching of the rows could alternatively be referred to as a row buffer or as a shadow copy of the recent row writes.

With row caching, the row writes are buffered in the row cache, which can include the row ECC data for the corresponding rows. For a row read, the row and row ECC can trigger a check for a cache hit, and for rows not in the cache, the data and row ECC can be read from the memory array. For column reads, the column and column ECC can be read from the memory array and then updated based on data stored in the row cache.

In one example, when the row write cache is full, or when power loss is imminent, or at another time, the system can flush the cache to the memory array and update the column ECC. In one example, the system can flush the cache on PLI (power loss imminent). The cache flush can take a significant amount of time, but can be scheduled in such a way that can reduce the performance impact. The row write cache is not as fast as, and has degraded quality of service, relative to the column ECC cache. In one example, the row write cache requires less caching than the column ECC cache, and can be more adjustable relative to trading off between resources and performance.

Each of the approaches is described with reference to on-die ECC logic with ECC encode and decode operations on the memory chip. Each approach could alternatively be applied at the controller associated with the memory device. For example, the column ECC update approach can be applied with the controller computing row ECC to send with the row write, and then issuing additional writes to update the column ECC. As another example, the column ECC cache approach can be applied with the application of a column ECC cache at the controller. The controller can then manage the column ECC in the cache and apply cached ECC values to check and correct columns received from the memory array. As another example, the row write cache can be applied at the controller. The controller can cache a copy of the written row information. In response to receipt of column read data, the controller can apply updates to the received data based on information stored in the row write cache at the controller. Thus, it will be understood that descriptions related to any of the approaches can be applied at the memory device itself as on-die ECC, or at the controller.

FIG. 1 is a block diagram of an example of a system with a memory device having row error correction for row reads and column error correction for column reads of dynamic data. System 100 illustrates a system with three different types of memory. An implementation of a system with row error correction and column error correction may have only one type of memory, or may have more than one type of memory, but only one type having the row error correction and column error correction. System 100 illustrates all three types for purposes of illustration. Any combination of the three types of memory could be implemented in an example system.

Host 110 represents a hardware platform to which memory and other peripheral subsystems are connected. The hardware platform includes a host processor that generates memory access requests during execution. The processor can include a central processing unit with one or more processor cores, a graphics processing unit with one or more cores, an application specific processor, or a combination of processors. Core 112 represents one or more processor cores of the host processor that generates memory access requests.

Either core 112 or another processor of host 110 executes a host operating system. The host operating system refers to software that controls the overall system and allows the connection of peripheral devices to provide data and services to the host system. The host operating system provides a software platform for host 110.

In one example, system 100 includes volatile DIMM (dual inline memory module) 140. Volatile DIMM 140 represents a module that has volatile memory. Volatile memory refers to memory whose state is indeterminate if power is interrupted to the memory device. In one example, system 100 can include a volatile memory module that is row addressable and column addressable, and maintains row ECC and column ECC for the memory array.

Volatile DIMM 140 includes volatile array 144, which represents a volatile memory that is row addressable and column addressable. The volatile memory array includes an array of columns and rows of bit cells or memory cells. In one example, the volatile memory array can be or include dynamic random-access memory (DRAM), static random-access memory (SRAM), or some other volatile memory. The volatile memory array can be spread across multiple different integrated circuits or memory chips included in volatile DIMM 140. Each cell represents an addressable memory location that stores one or more bits of data. Row ECC 146 represents row ECC corresponding to the rows of volatile array 144. Column ECC 148 represents column ECC corresponding to columns of volatile array 144.

Controller 150 represents a controller for volatile DIMM 140. Controller 150 represents a memory-side controller. The memory side controller refers to a controller on the memory device that controls the operation of the memory itself. Controller 150 is separate from the host controller that sends commands to the memory. Controller 150 receives commands from host 110, decodes the commands, and generates operations internal to volatile DIMM 140 to respond to the host request.

In one example, controller 150 maintains row ECC 146 and column ECC 148 for volatile array 144. In one example, controller 150 includes row ECC encoder 152, row ECC decoder 154, column (COL) ECC encoder 156, and column (COL) ECC decoder 158. In one example, row ECC encoder 152 represents logic that computes the row ECC from the row. In one example, row ECC decoder 154 represents logic that checks a row codeword, which includes a row and its row ECC, and corrects bit errors in the row codeword. In one example, column ECC encoder 156 represents logic that computes the column ECC from the column. In one example, column ECC decoder 158 represents logic that checks a column codeword, which includes a column and its column ECC, and corrects bit errors in the column codeword.

In one example, volatile DIMM 140 includes cache 142, which represents a cache or buffer for the control of two-dimensional ECC in accordance with any example described. In one example, cache 142 contains static random-access memory (SRAM). In one example, cache 142 represents a column ECC cache for volatile array 144. In one example, cache 142 represents a row write cache for volatile array 144.

In one example, system 100 includes nonvolatile DIMM 160. Nonvolatile DIMM 160 represents a module that has nonvolatile memory. Nonvolatile memory refers to memory whose state is determinate even when power is interrupted to the memory device. In one example, system 100 can include a nonvolatile memory module that is row addressable and column addressable, and maintains row ECC and column ECC for the memory array.

Nonvolatile DIMM 160 includes nonvolatile array 164, which represents a nonvolatile memory that is row addressable and column addressable. The nonvolatile memory array includes an array of columns and rows of bit cells or memory cells. In one example, the nonvolatile memory array can be or include three dimensional crosspoint (3DXP) memory, OPTANE memory, or other nonvolatile memory addressable as rows and columns. Nonvolatile array 164 can be spread across multiple different integrated circuits or memory chips included in nonvolatile DIMM 160. Each cell represents an addressable memory location that stores one or more bits of data. Row ECC 166 represents row ECC corresponding to the rows of nonvolatile array 164. Column ECC 168 represents column ECC corresponding to columns of nonvolatile array 164.

Controller 170 represents a controller for nonvolatile DIMM 160. Controller 170 represents a memory-side controller. Controller 170 is separate from the host controller that sends commands to the memory. Controller 170 receives commands from host 110, decodes the commands, and generates operations internal to nonvolatile DIMM 160 to respond to the host request.

In one example, controller 170 maintains row ECC 166 and column ECC 168 for nonvolatile array 164. In one example, controller 170 includes row ECC encoder 172, row ECC decoder 174, column (COL) ECC encoder 176, and column (COL) ECC decoder 178. In one example, row ECC encoder 172 represents logic that computes the row ECC from the row. In one example, row ECC decoder 174 represents logic that checks a row codeword, which includes a row and its row ECC, and corrects bit errors in the row codeword. In one example, column ECC encoder 176 represents logic that computes the column ECC from the column. In one example, column ECC decoder 178 represents logic that checks a column codeword, which includes a column and its column ECC, and corrects bit errors in the column codeword.

In one example, nonvolatile DIMM 160 includes cache 162, which represents a cache or buffer for the control of two-dimensional ECC in accordance with any example described. In one example, cache 162 represents a column ECC cache for nonvolatile array 164. In one example, cache 162 represents a row write cache for nonvolatile array 164.

In one example, system 100 includes SSD (solid state drive) 180. SSD 180 represents a drive or module that has nonvolatile memory. SSD 180 represents nonvolatile memory on storage bus 132, and nonvolatile DIMM 160 represents nonvolatile memory on memory bus 122. In one example, system 100 can include SSD 180 with nonvolatile array 184 that is row addressable and column addressable, and maintains row ECC and column ECC for the memory array.

SSD 180 includes nonvolatile array 184, which represents a nonvolatile memory that is row addressable and column addressable. The nonvolatile memory array includes an array of columns and rows of bit cells or memory cells. In one example, the nonvolatile memory array can be or include three dimensional crosspoint (3DXP) memory, OPTANE memory, or other nonvolatile memory addressable as rows and columns. Nonvolatile array 184 can be spread across multiple different integrated circuits or memory chips included in SSD 180. Each cell represents an addressable memory location that stores one or more bits of data. Row ECC 186 represents row ECC corresponding to the rows of nonvolatile array 184. Column ECC 188 represents column ECC corresponding to columns of nonvolatile array 184.

Controller 190 represents a controller for SSD 180. Controller 190 represents a memory-side controller, and can more specifically be referred to as a media controller. Controller 190 is separate from the host controller that sends commands to the memory. Controller 190 receives commands from host 110, decodes the commands, and generates operations internal to SSD 180 to respond to the host request.

In one example, controller 190 maintains row ECC 186 and column ECC 188 for nonvolatile array 184. In one example, controller 190 includes row ECC encoder 192, row ECC decoder 194, column (COL) ECC encoder 196, and column (COL) ECC decoder 198. In one example, row ECC encoder 192 represents logic that computes the row ECC from the row. In one example, row ECC decoder 194 represents logic that checks a row codeword, which includes a row and its row ECC, and corrects bit errors in the row codeword. In one example, column ECC encoder 196 represents logic that computes the column ECC from the column. In one example, column ECC decoder 198 represents logic that checks a column codeword, which includes a column and its column ECC, and corrects bit errors in the column codeword.

In one example, SSD 180 includes cache 182, which represents a cache or buffer for the control of two-dimensional ECC in accordance with any example described. In one example, cache 182 represents a column ECC cache for nonvolatile array 184. In one example, cache 182 represents a row write cache for nonvolatile array 184.

In one example, either cache 162 or cache 182 used to maintain ECC data in two spatial dimensions, can be a power-fail-protected memory. Applying power failure protection to cache 142 would not make sense because the ECC data for volatile DIMM 140 is stored in volatile memory. A power fail protected memory can refer to a memory device that is backed up by an energy source or energy store, such as a battery or high capacity capacitor. The memory used for cache 162 or cache 182 can be volatile memory, which is traditionally much faster to read and write than available nonvolatile memories.

Despite being volatile, upon detection of a power down or a power failure, or other condition that would interrupt power to the cache, the backup energy source can power the cache for long enough to transfer the contents of the ECC cache to the corresponding memory array. Thus, the ECC data can be copied from volatile to nonvolatile memory. The energy source can be, for example, high capacity capacitors, or a battery source.

In one example, cache 162 or cache 182 represents a nonvolatile memory used for column ECC storage, such as MRAM (magnetic random-access memory), STTRAM (spin transfer torque random-access memory), or other memory. In such an implementation, the memory array could potentially eliminate the storage of column ECC 168 or ECC 188, and the column ECC be stored only in the cache.

In one example, controller 150 can be a controller on a DIMM. In one example, controller 150 can be a controller on a memory die or memory device. In one example, controller 170 can be a controller on a DIMM. In one example, controller 170 can be a controller on a memory die or memory device. In one example, controller 190 can be a controller on an SSD. In one example, controller 190 can be a controller on the storage media die or device. Controller 150, controller 170, and controller 190 represent access controllers, as they control access to the memory or storage media of their respective memory devices.

In one example, host 110 includes memory controller 120 to couple to volatile DIMM 140 and nonvolatile DIMM 160 via memory bus 122. Memory bus 122 represents a group of signal lines to interconnect the memory resources with the host processor. Typically, memory bus 122 represents a high-speed interface. Memory bus 122 includes data signal lines for exchanging data, and control signal lines to enable memory controller 120 to send commands and requests to the memory devices. In one example, memory controller 120 is integrated onto a system on a chip or onto a die with a host processor.

In one example, host 110 includes storage controller 130 to couple to SSD 180 via storage bus 132. Storage bus 132 represents a group of signal lines to interconnect the memory resources with the host processor. Storage bus 132 is typically an interface that is not as high-speed as memory bus 122. Storage bus 132 includes data signal lines for exchanging data, and control signal lines to enable storage controller 130 to send commands and requests to SSD 180.

For any access controller of system 100 (i.e., controller 150, controller 170, or controller 190) that manages access to a memory array that is row addressable and column addressable, with both row ECC data and column ECC data, in one example, the controller manages or maintains the row ECC and column ECC in accordance with one of the following.

In one example, the memory resources include a column ECC cache and the controller implements a column ECC cache algorithm or implements a column ECC cache approach to maintaining ECC data in two spatial dimensions. The two spatial dimensions can be referred to as the row dimension and the column dimension. They could also, respectively, be referred to as x-axis and y-axis, respectively, choosing an orientation where rows are aligned along the x-axis.

In one example, the column ECC cache approach updates the ECC information in the column ECC cache for each column that had a bit change. In one example, the controller knows which columns have a bit that changed with the row write due to a write process for the memory array. For example, certain 3DXP memories perform a write by first reading the row, identifying bits to change, and then writing back only the bits to be changed with the write. Such a write operation can avoid re-writing bits already in the correct state, which effectively turns the write into a read-modify-write. In one example, the memory array includes circuitry to detect the columns that are changed by a row write during a read-modify-write (RMW) operation, and allow a change of column ECC data only for updated columns.

In one example, for each column to be changed with the row write, the controller reads the previous column ECC out of the ECC cache. In one example, knowing what row is changed, the controller will know the position of the bit in the column codeword that changed, and can use the column ECC encoder to compute a new column ECC to write back into the cache. In one example, the memory device applies codes that have a linearity to enable the simple computation of new column ECC based on knowing the position of the changed bit.

In one example, changing a row results in changing bits in multiple columns. In one example, the memory device includes circuitry in the column ECC encoder that enables the computation of the updated column ECC for more than one column in parallel. In one example, the updates to more than one column ECC value in parallel can be performed in a single operation.

In one example, the memory device transposes the column ECC data and stores it in rows of data instead of in columns. In one example, column ECC for multiple columns can be stored in one row, and the memory device can update the column ECC for multiple columns in parallel by writing a row of data to the memory array. For a memory that does not write columns, the column ECC data can be transposed and stored as a row.

In one example, when the controller reads a column, the controller reads the column ECC for the target column from the column ECC cache rather than from the array. After a row is written, the column ECC bits in the array are stale for the changed columns. The column ECC bits in the column ECC cache are up to date and can be used by the column ECC decoder to correct bits in error for a column read.

In one example, a controller using a column ECC cache applies a parity write back cache that has enough rows to store a row for every column ECC bit in a column. A memory device may have hundreds of ECC bits, which would require hundreds of rows in a table with a row for every column ECC bit. Typically, a row write changes many bits (which could be near 50% of the bits when scrambling algorithms are used). Thus, up to approximately 50% of columns could need updates to their column ECC values on average.

In one example, the memory resources include a row write cache and the controller implements a row write cache algorithm or implements a row write cache approach to maintaining ECC data in two spatial dimensions. In one example, the row write cache approach applies a write-back cache of recently written rows, which avoids the need to update the column ECC on each row write. The column ECC will eventually need to be updated, but the delay can reduce the penalty for updating column ECC values. The penalty is reduced as the cost of updating column ECC data is amortized by spreading it over many row writes. It will be understood that the amortization is a function of the size of the row cache.

It will be understood that the use of a cache for the row write approach requires additional resources in the memory device, as does the use of a cache for the column ECC cache approach. The column ECC cache approach provides better performance than a row write cache approach for the same size cache. Thus, the advantage of a row write cache approach over a column ECC cache approach is most likely achieved when the size of the row write cache is smaller than a comparable cache used as a column ECC cache. Thus, the size of the row write cache may be constrained to hold fewer rows as there are column ECC bits per column. Such a limitation can be expressed as $N_R < N_B$, where $N_R$ represents a number of rows in the row write cache, and $N_B$ represents a number of bits of column ECC.

In one example, when a row is written, the controller places the row in the cache of rows and does not immediately update it in the memory array. When a row is read in response to a host row read request, if that row is in the row write cache, the row read results in a cache hit. With a cache hit, the controller reads the row from the row write cache and not from the array.

If the row is not in the row write cache (i.e., a cache miss), the controller reads the row from the memory array. In one example, when a column is read in response to a host column read request, the controller reads the column from the memory array and initially uses the column ECC decoder to corrects it using the column ECC value from the memory array. In one example, the controller updates the column data with corresponding bits in the column from each row in the row cache. After correcting the column data, the controller can return the column data to the host in response to the read command.

In one example, when the write back cache is full, the controller suspends or postpones normal operation to flush the cache to nonvolatile memory. Suspending operation will degrade the quality of service. The flushing of the cache can be referred to as a write back operation. In one example, the write back operation includes updating the column ECC based on the data in the row write cache, and writing the column ECC values back to the memory array. In one example, after the write back operation is complete, normal operation may resume.

In one example, the controller sets a nonvolatile flag, indicating that the memory array is being updated with a row cache write back operation. If the flag is set to indicate an update to the memory array and a power failure occurs, there is a risk of data loss. By making the flag nonvolatile, even if a power failure occurs, upon restoration of power, the memory device can return to the write back operation. In one example, for each column in the memory array, the controller reads the column data from the memory array and the corresponding ECC data. The controller can correct the column data using the column ECC decoder and the column ECC bits in the array.

In one example, the controller reads the column data from the memory array and updates the column data with the bit corresponding to the column from each valid row in the cache. In one example, after updating the column data with the cached row data, the controller uses the column ECC encoder to compute a new column ECC value for the associated column data. The controller can write the updated column data to the memory array and write the updated column ECC data to the memory array.

In one example, the memory device can include column write capability to perform a column update. In one example, if the memory device does not include capability for column writes, the controller can skip scrubbing errors found in column ECC corrections and write only the rows that correspond to column ECC data. Such an approach might require enough cache space in the memory device to store as many rows as there are column ECC bits, in which case the column ECC cache approach can provide better performance for the same amount of resources.

In one example, the controller writes each row from the row write cache to the memory array. For each row write, the controller also writes the corresponding row ECC value to the memory array. In one example, where the row ECC is not stored in the row write cache, for each row write, the controller uses the row ECC encoder to compute the row ECC value before the row ECC is written to the memory array. In one example, if the row write from the cache to the memory array does not result in a change to the row, the column ECC bits may not be invalidated for that row, and the column ECC bits would not need to be updated.

In one example, the controller marks each entry in the row write cache as empty after it has been written to the memory array. It will be understood that if the cache is a power fail safe cache and there is a power failure between the row write and the writing of the row entry as empty in the row write cache, upon restoration of power, the row write can be repeated with no loss of information. In one example, the controller then resets the nonvolatile flag that indicates the array is being updated. It will be understood that power failure recovery can be accomplished by starting the write back operation again.

Consider an example where the row write cache holds 10% of the rows in the array, and the write back writes the entire array plus the rows that were cached. The average performance of the memory device, which is approximately proportional to the number of array writes, would be (1+100%/10%)=11 times worse than without column reads. Power and endurance would also be about 11 times worse. If a row is rewritten before a write back operation occurs, that row write is essentially free and performance improves in proportion to how often this happens. Given that the algorithms utilizing column read capability can be orders of magnitude faster than those without column read capability, a penalty of 11× can be tolerated or considered acceptable performance. It will be understood that the row write cache approach could also cause a noticeable quality of service penalty.

In one example, the memory resources do not include a cache to use for ECC data update, and the controller implements a column ECC update algorithm or a column ECC update approach to maintaining ECC data in two spatial dimensions. The performance impact of updating column ECC data with each row write can be so significant, as a practical matter it may make sense to restrict the application of the column ECC update approach to situations where a workload is known to only change one or only a few bits at a time. In one example, the column ECC update approach is used when the average number of changes per row write is in the single digits (i.e., fewer than 10 bits changed per write).

The column ECC update approach is simpler than either the column ECC cache approach or the row write cache approach, and requires fewer resources. However, the write amplification factor can make the column ECC update approach impractical if more than a few bits in a row change.

In such an approach, a row write simply writes the row data and row ECC bits to the memory array. In one example, a circuit detects which bits in the row have changed and writes only the bits that have new values. In one example, the circuit output is also fed to logic that determines which columns have changed based on the row bit changes. The controller can then use the column ECC encoder to recalculate column ECC bits and write updated column ECC bits to the memory array. However, it will be understood that a change to even one bit in the row can cause an update to hundreds of column ECC bits.

In one example, the controller reads the column corresponding to a changed row bit, including reading its column ECC data. The controller can then use the column ECC decoder to correct the column using its column ECC value, update the column with the row data, use the column ECC encoder to compute the updated column ECC, and write the updated column and column ECC back to the memory array.

Column reads take one memory operation. Row reads also take one memory operation. In one example, row writes take 1 write for the row and its row ECC value, plus 1 read operation and one write operation for each bit changed in the row to update each column ECC value. As specific examples, if one bit changes, a row write is two writes and a read. Thus, if a single bit changes, performance, power and endurance is about 3× worse than if no column reads were allowed. If 10 bits change, 21 operations are required for a row write. It will be observed that at only 10 bits changed with a row write, the performance of the column ECC update approach is worse than the row write cache approach for a memory device with a 5% row cache capability (i.e., a row write cache that includes a number of rows equal to 5% of the total number of rows in the memory array).

Figure 2A:
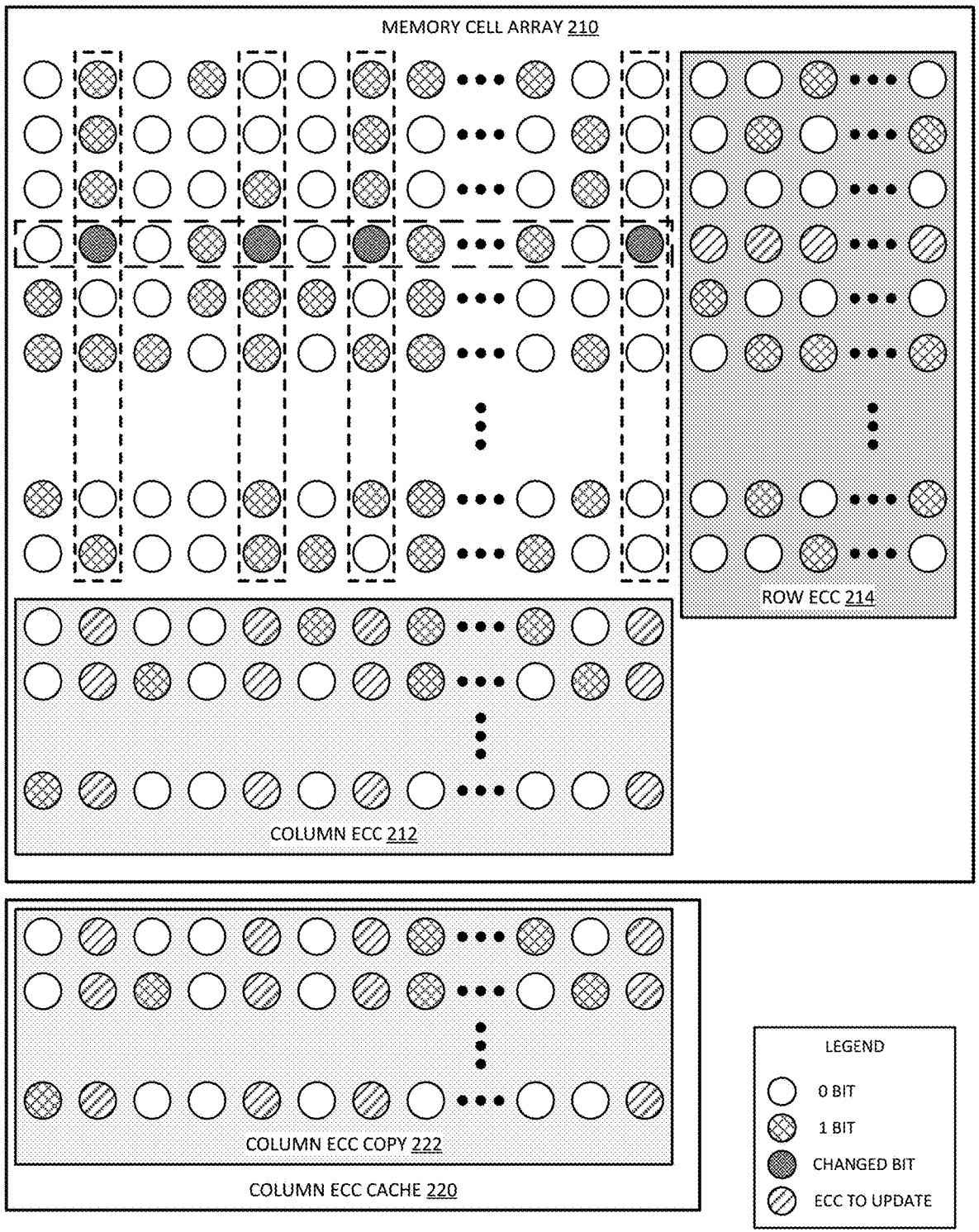
FIG. 2A is a block diagram of an example of a system with a memory device having a cache for column error correction data.

FIG. 2A is a block diagram of an example of a system with a memory device having a cache for column ECC values. System 202 represents a column ECC cache approach in accordance with system 100. System 202 does not illustrate an access controller, but a controller or control logic will perform operations related to maintaining the row ECC and column ECC.

Memory cell array 210 represents a memory cell array for a volatile or nonvolatile memory. In one example, memory cell array 210 represents an array of 3DXP memory cells. Each circle represents a bit in the memory cell array. Memory cell array 210 includes the primary data bits, row ECC 214 to represent the row ECC bits or row ECC values (e.g., one value or one group of check bits per row in the array), and column ECC 212 to represent the column ECC bits or column ECC value (e.g., one value or one group of check bits per column in the array).

The legend for the bit shading is as follows. The white circles with no shading represent "0" bits, or a logic zero. The crosshatched circles represent "1" bits, or a logic one. The circles with the dark shading represent bits that changed with the row write. The changed row is bordered with a dashed line. The circles with the diagonal lines represent ECC bits that need to be updated because of a change in the corresponding row or column. The columns changed by the bit changes in the row are bordered by dashed lines.

In addition to memory cell array 210, system 202 includes column ECC cache 220. Column ECC cache 220 includes column ECC copy 222, which represents a copy of some or all of column ECC 212. In one example, column ECC copy 222 is a volatile copy of a nonvolatile copy of column ECC 212. In one example, column ECC cache 220 is a power fail safe cache or power fail safe memory.. In one example, column ECC cache 220 is a parity write back cache that has enough rows to store a row for every column ECC bit in a column, which could be up to hundreds of rows. In one example, column ECC cache 220 can be implemented as a buffer table.

In one example, column ECC cache 220 stores column ECC copy 222 as columns of data, where each row of the cache has a bit of each column. In one example, column ECC cache 220 stores the column ECC data transposed, where each row of column ECC cache 220 includes one or more columns of data. In one example, column ECC cache 220 stores column ECC copy 222 in a different orientation than column ECC 212, such as in columns in column ECC 212, and transposed in rows in column ECC cache 220.

In one example, in accordance with the column ECC cache algorithm, the controller can update the ECC information for each column that had a bit change in column ECC cache 220. It will be observed that by limiting to updating only the columns having a changed bit, the number of columns for which to update the ECC can be much lower than all columns.

As illustrated, column ECC 212 has the same values for its column ECC values as column ECC copy 222. It will be understood that if the column ECC information is cached in column ECC cache 220, most of the time the ECC data in column ECC 212 will not match what is in column ECC copy 222. From one perspective, after several row writes, most of column ECC 212 could be identified as column ECC values needing to be updated, whereas column ECC copy 222 contains the current column ECC information.

A controller (not shown) stores column ECC values in column ECC cache 220 for column ECC values updated in response to a write to the selected row. The selected row is illustrated by the dashed line, and could alternatively be referred to as the target row for the write request. In response to a read request from the host, the controller can read a column ECC value for a target column or column selected by the read request, from column ECC cache 220 instead of from memory cell array 210.

In one example, in response to the data write, the controller reads the column data from memory cell array 210 including associated column ECC 212 for a column changed by the data write. The controller can use the column ECC encoder to compute a new column ECC value consistent with the data write and write the updated column ECC to column ECC copy 222. In one example, in response to the data write, the controller can read the column data from memory cell array 210, and read column ECC data from column ECC copy 222, use the column ECC encoder to update the column ECC value, and then write the updated column ECC back to column ECC cache 220.

Figure 2B:
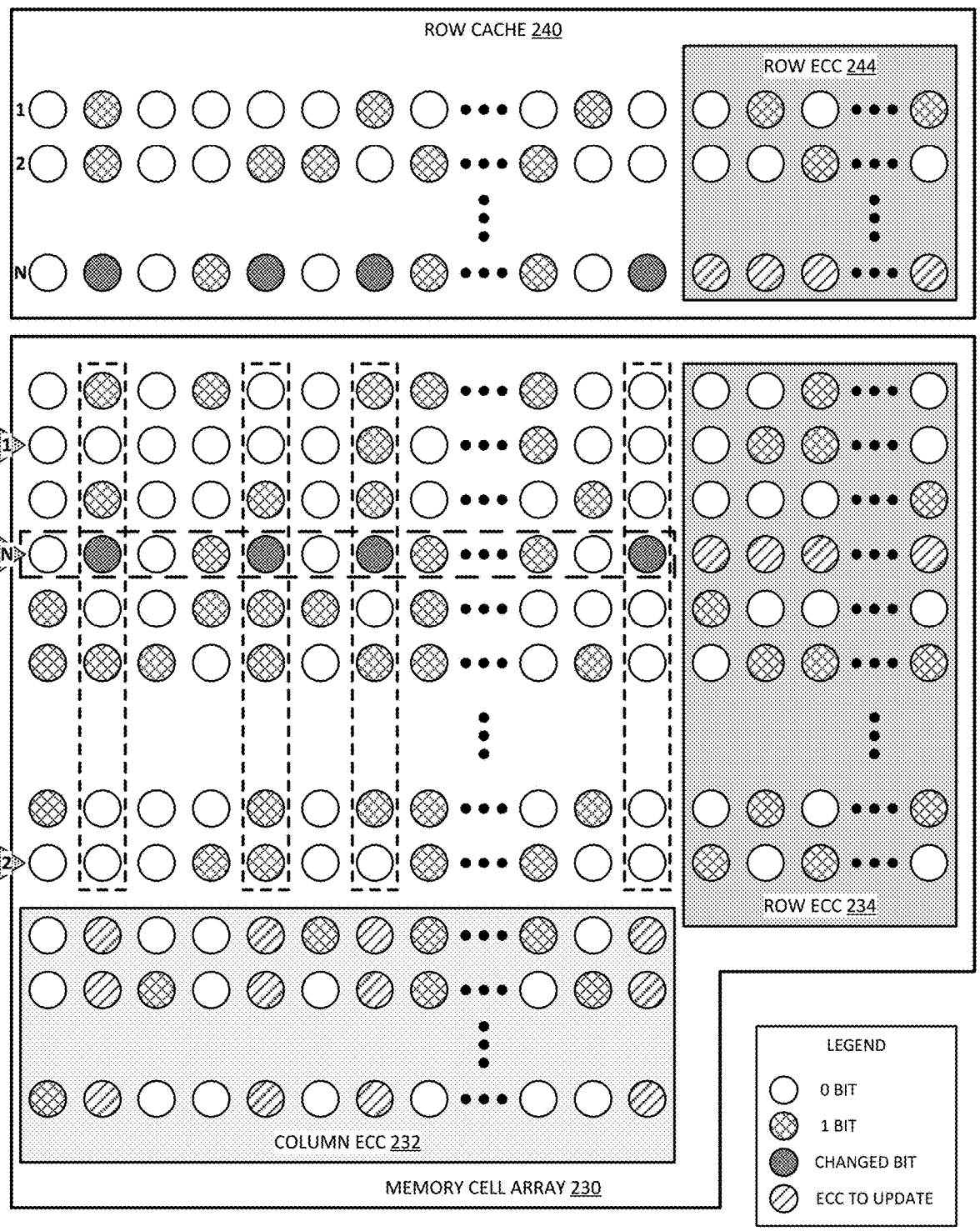
FIG. 2B is a block diagram of an example of a system with a memory device having a cache for row writes that can be used to update column error correction data.

FIG. 2B is a block diagram of an example of a system with a memory device having a cache for row writes that can be used to update column ECC values. System 204 represents a row write cache approach in accordance with system 100. System 204 does not illustrate an access controller, but a controller or control logic will perform operations related to maintaining the ECC data.

Memory cell array 230 represents a memory cell array for a volatile or nonvolatile memory. For purposes of illustration of the difference between the column ECC approach of system 202 and the row write cache approach of system 204, the data values in memory cell array 230 are the same as those in memory cell array 210 of system 202, with the exception of the two rows identified as having been previously cached in row cache 240.

In one example, memory cell array 230 represents an array of 3DXP memory cells. Each circle represents a bit in the memory cell array. Memory cell array 230 includes the primary data bits, row ECC 234 to represent the row ECC bits or row ECC values (e.g., one value or one group of check bits per row in the array), and column ECC 232 to represent the column ECC bits or column ECC value (e.g., one value or one group of check bits per column in the array).

The legend for the bit shading is as follows. The white circles with no shading represent "0" bits, or a logic zero. The crosshatched circles represent "1" bits, or a logic one. The circles with the dark shading represent bits that changed with the row write. The changed row is bordered with a dashed line. The circles with the diagonal lines represent ECC bits that need to be updated because of a change in the corresponding row or column. The columns changed by the bit changes in the row are bordered by dashed lines.

In addition to memory cell array 230, system 204 includes row cache 240, which represents an example of what is also referred to as a row write cache in the description. Row cache 240 represents a buffer of some of the rows of memory cell array 230 and a cache or row ECC 244. Typically, row cache 240 is a volatile copy of nonvolatile data of memory cell array 230. In one example, row cache 240 is a power fail safe cache. Row cache 240 buffers recently written rows, and can be managed in accordance with any buffer algorithm (e.g., FIFO (first in, first out), LRU (least recently used), or other algorithm).

Row cache 240 specifically illustrates two rows to represent recently updated rows from memory cell array 230. The row labeled with the '1' can be seen to have differences in row cache 240 relative to the corresponding row in memory cell array 230. Similarly, the row labeled with the '2' can be seen to have differences in row cache 240 relative to the corresponding row in memory cell array 230. It will be understood that depending on the write algorithm of the memory subsystem, the number of bits changed (and thus the number of bits that would be different between corresponding rows in row cache 240 and memory cell array 230) could be up to 50% of the rows on average. For purposes of simplicity, just a few bits are shown to be different in system 204.

In one example, row cache 240 is a write-back cache of recently written rows that can reduce the penalty for updating column ECCs. By writing rows to row cache 240 instead of directly into memory cell array 230, the system can amortize the cost of updating column ECC by spreading it over many row writes. The column ECC can be updated when the cache is flushed to memory cell array 230.

In one example, when a row is written, it is placed in row cache 240 and not updated in the memory cell array 230. When a row is read, if that row is in row cache 240, the controller reads it from row cache 240 and not from memory cell array 230. If the row is not in row cache 240, the controller reads it from memory cell array 230. When a column is read, the controller can read the column data from memory cell array 230 and correct the column data with column ECC 232 from the memory array. In one example, the controller then updates the bits in the column data with corresponding bits from each row in row cache 240 before returning the column data to respond to the read request.

In one example, when row cache 240 is full of dirty rows, and by definition, all rows written to row cache 240 are dirty, the controller can suspend normal operation to perform write back operations. The controller to suspend the operation will typically be the controller managing the row cache. Thus, when row cache 240 is a cache at the memory device, the controller to control suspension of normal operation is the controller of the memory device or memory module. When row cache 240 is a cache at the host or the memory controller or storage controller, the host side controller manages suspension of normal operation to perform write back.

Figure 3:
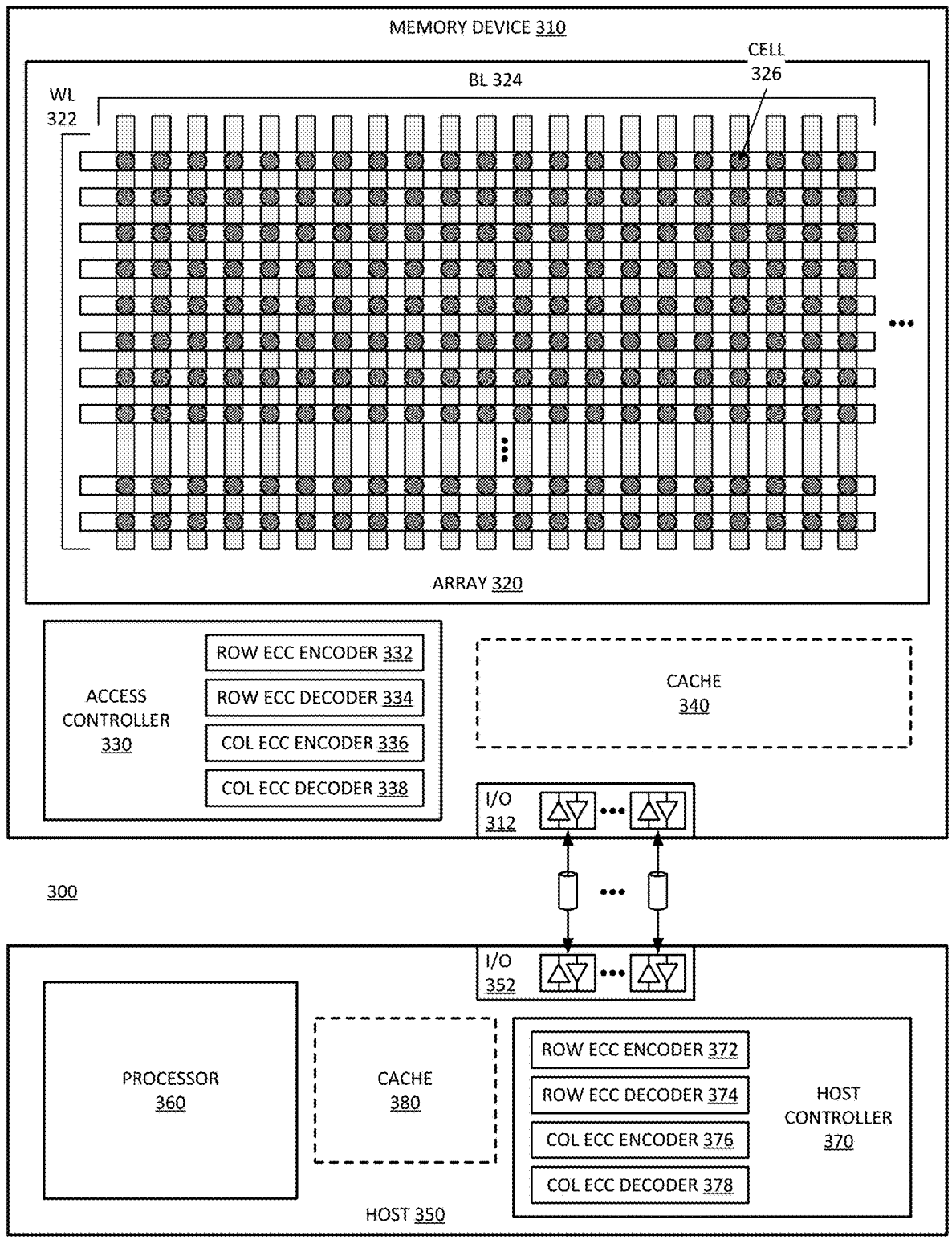
FIG. 3 is a block diagram of an example of a system with a memory device having crosspoint memory cells that maintains row error correction and column error correction.

FIG. 3 is a block diagram of an example of a system with a memory device having crosspoint memory cells that maintains row ECC values and column ECC values. System 300 illustrates an example of a system consistent with an example of system 100 of FIG. 1, system 202 of FIG. 2A, or system 204 of FIG. 2B.

Memory device 310 represents a volatile memory or nonvolatile memory device that maintains row ECC values and column ECC values for array 320. Array 320 represents an array of cells, such as cell 326. Each cell is a memory cell or bit cell, and is located at a location where a wordline (WL) 322 or row conductor crosses a bitline (BL) 324 or column conductor. A crosspoint memory can include material between the intersecting row and column. In one example, the material stores a bit of data by changing a resistive state. In one example, the material stores a bit of data based on an orientation of a field of the cell.

Array 320 can be of any size, with a number of WL 322 and a number of BL 324. Typically, the number of BL 324 is more than the number of WL 322. Array 320 is written as rows of bits, and can be read either as rows of bits or columns of bits. While not specifically labeled, some of the bits of array 320 are used to store row ECC values, and some of the bits of array 320 are used to store column ECC values.

In one example, memory device 310 includes cache 340, which can represent either a row write cache or a column ECC cache in accordance with any description herein. Access controller 330 represents a memory side controller, and manages and maintains the row ECC values and the column ECC values. In response to a data write, access controller 330 updates the row data and updates row ECC values and column ECC values in accordance with any approach described. In response to a read request, access controller 330 can access the appropriate data (e.g., row data or column data), and update the data based on the ECC data before returning the requested data. In one example, access controller 330 includes row ECC encoder 332, row ECC decoder 334, column ECC encoder 336, and column ECC decoder 338.

Memory device 310 includes I/O (input/output) 312, which represents an I/O interface for the memory device. I/O 312 includes hardware to interface with multiple signal lines. The signal lines include data signal lines to exchange data, and control signal lines to exchange control signals. The control signal lines can include command signal lines to provide a command or request to the memory device from the host, address signal lines to identify a target or selected address for the command or request, and other control signal lines, such as alert lines or other peripheral control signals. Typically, command and address lines are sent only from the host to the memory device. Other signal lines can be from memory device to host, from host to memory device, or be bidirectional.

Host 350 represents a host platform to which memory device 310 is connected. Host 350 includes I/O 352, which represents hardware to connect host 350 to the signal lines coupling the host to memory device 310. Host 350 includes processor 360, which represents a host processor to generate requests for data from memory device 310. Host controller 370 represents a memory controller if memory device 310 is coupled to the memory bus, or a storage controller if memory device 310 is coupled to the storage bus.

In one example, host 350 includes cache 380, which can represent either a row write cache or a column ECC cache in accordance with any description herein. It will be understood that different components in system 300 are not necessarily illustrated to scale. If host 350 includes cache 380, host controller 370 can manage and maintain the row ECC values and the column ECC values, internally within host 350. Such ECC values are not specifically illustrated, but host 350 can include an array of ECC values to maintain and manage the row ECC values and the column ECC values. In one example, host controller 370 includes row ECC encoder 372, row ECC decoder 374, column ECC encoder 376, and column ECC decoder 378.

In response to a data write, host controller 370 can send a command to memory device 310 to update the row data, and can update the row ECC data and column ECC data in accordance with any approach described within host 350. In response to a read request, host controller 370 can access the appropriate data (e.g., row data or column data) by a read request to memory device 310, and update the data within host 350 based on the ECC data.

Figure 4:
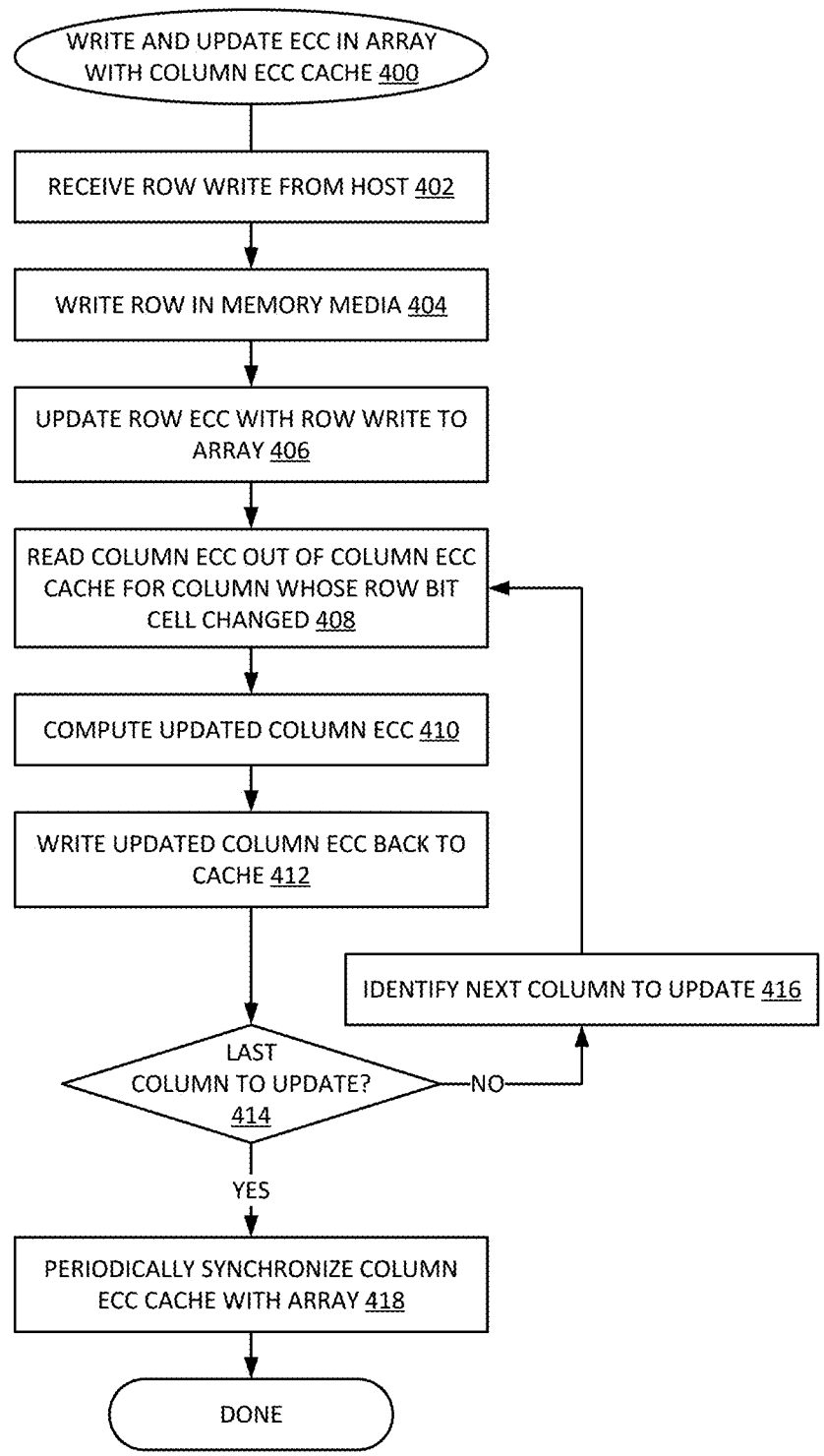
FIG. 4 is a flow diagram of an example of a process for writing to a memory with a column error correction cache.

FIG. 4 is a flow diagram of an example of a process for writing to a memory with a column ECC cache. Process 400 for writing and updating ECC in a system with a column ECC cache can be implemented by any controller that manages the column ECC cache.

In one example, the host generates a row write to send to the memory device, at 402. In response to the row write, the memory device can write the row to the memory media, at 404. The row ECC can be updated with the row data when the row is written to the array, at 406.

In one example, the controller reads the column ECC out of the column ECC cache for a column whose bit cell changed, at 408. In one example, the controller uses the column ECC encoder to update the column ECC based on the changed bit cell from the row that was written, at 410. The controller writes the updated column ECC back to the column ECC cache, at 412.

If the column whose ECC was updated is not the last column to update, at 414 NO branch, the controller can identify the next column to update, at 416, and repeat the operations to update the column ECC value, at 408. If the column updated is the last column to update, at 414 YES branch, the controller can stop updating the column ECC cache until the next row write. In one example, the controller can periodically synchronize the column ECC values in the array with the column ECC values in the cache, at 418. The updating of the array could be performed only at power state changes, or during idle periods, or some other time determined by the controller.

Figure 5:
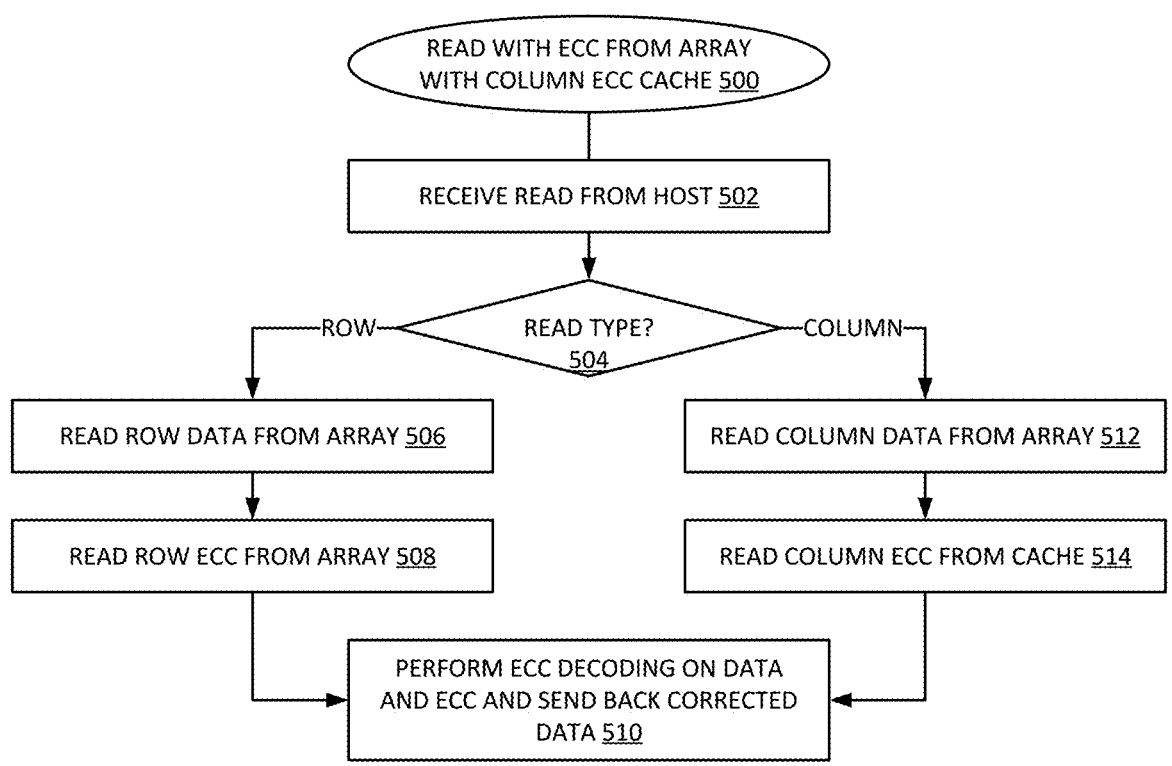
FIG. 5 is a flow diagram of an example of a process for reading from a memory with a column error correction cache.

FIG. 5 is a flow diagram of an example of a process for reading from a memory with a column ECC cache. Process 500 for reading data and correcting bit errors in a system with a column ECC cache can be implemented by any controller that manages the column ECC cache.

The host generates a read to the memory device, which can receive the read, at 502. If the read is a row read, at 504 ROW branch, the controller can read the row data from the array, at 506. The controller also reads the row ECC from the array, at 508. The controller can use the row ECC decoder to correct bit errors in the row data and the row ECC values and then the controller can send the corrected row data back to the host, at 510.

If the read is a column read, at 504 COLUMN branch, the controller can read the column data from the array, at 512. In one example, the controller reads the column ECC from the column ECC cache instead of from the array, at 514. The controller can use the column ECC decoder to correct bit errors in the column data and the column ECC value. Then the controller sends the corrected column data back to the host, at 510.

Figure 6:
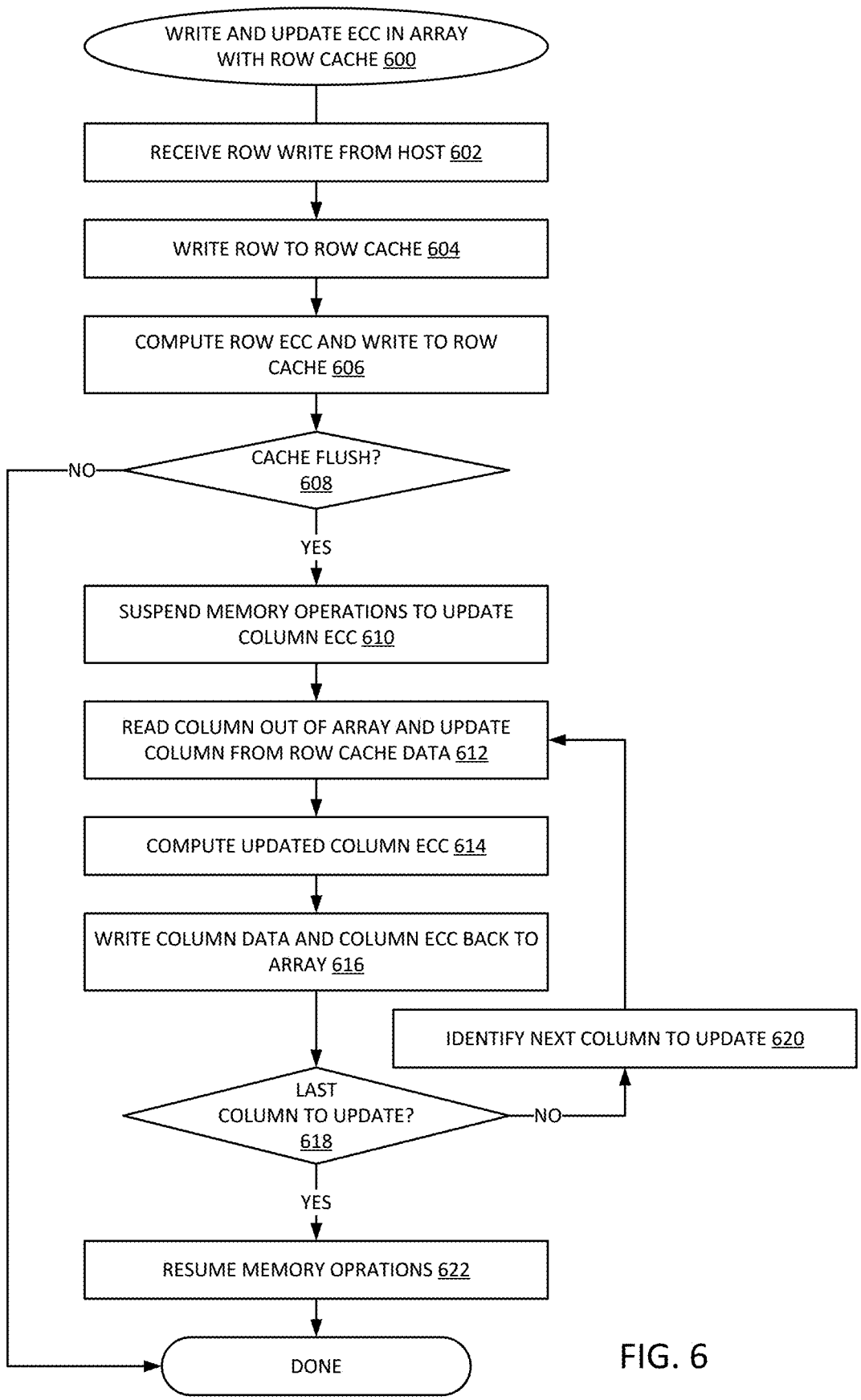
FIG. 6 is a flow diagram of an example of a process for writing to a memory with a row cache and row error correction and column error correction.

FIG. 6 is a flow diagram of an example of a process for writing to a memory with a row cache and row error correction and column error correction. Process 600 for writing and updating ECC values in a system with a row write cache can be implemented by any controller that manages the row write cache.

In one example, the host generates a row write to send to the memory device, which can receive the row write request, at 602. In response to the row write, the memory device can write the row to the row cache, at 604. In one example, the row ECC can computed using the row ECC encoder. In one example, the updated row ECC can be written with the row data to the row cache, at 606.

In one example, the controller determines if the row cache should be flushed to the memory array. The controller can flush the cache when the cache is full. In one example, the controller can flush the cache in response to other events. If the cache is not to be flushed, at 608 NO branch, the process can end and the controller will await the next write request before another update to row ECC values and column ECC values.

If the cache is to be flushed, at 608 YES branch, in one example, the controller suspends the memory operations to update the column ECC and flush the cache, at 610. In one example, the controller reads the column data out of the array and updates the column from the row cache data, at 612. The controller can then use the column ECC encoder to compute the updated column ECC based on the updated column data, at 614. In one example, the controller writes the updated column data back to the array and also writes the updated column ECC data back to the array, at 616.

If the column whose ECC was updated is not the last column to update, at 618 NO branch, the controller can identify the next column to update, at 620, and repeat the operations to update the column ECC value, at 612. If the column updated is the last column to update, at 618 YES branch, the controller can stop updating the column ECC, terminate the cache write back operations, and resume memory operations, at 622.

Figure 7:
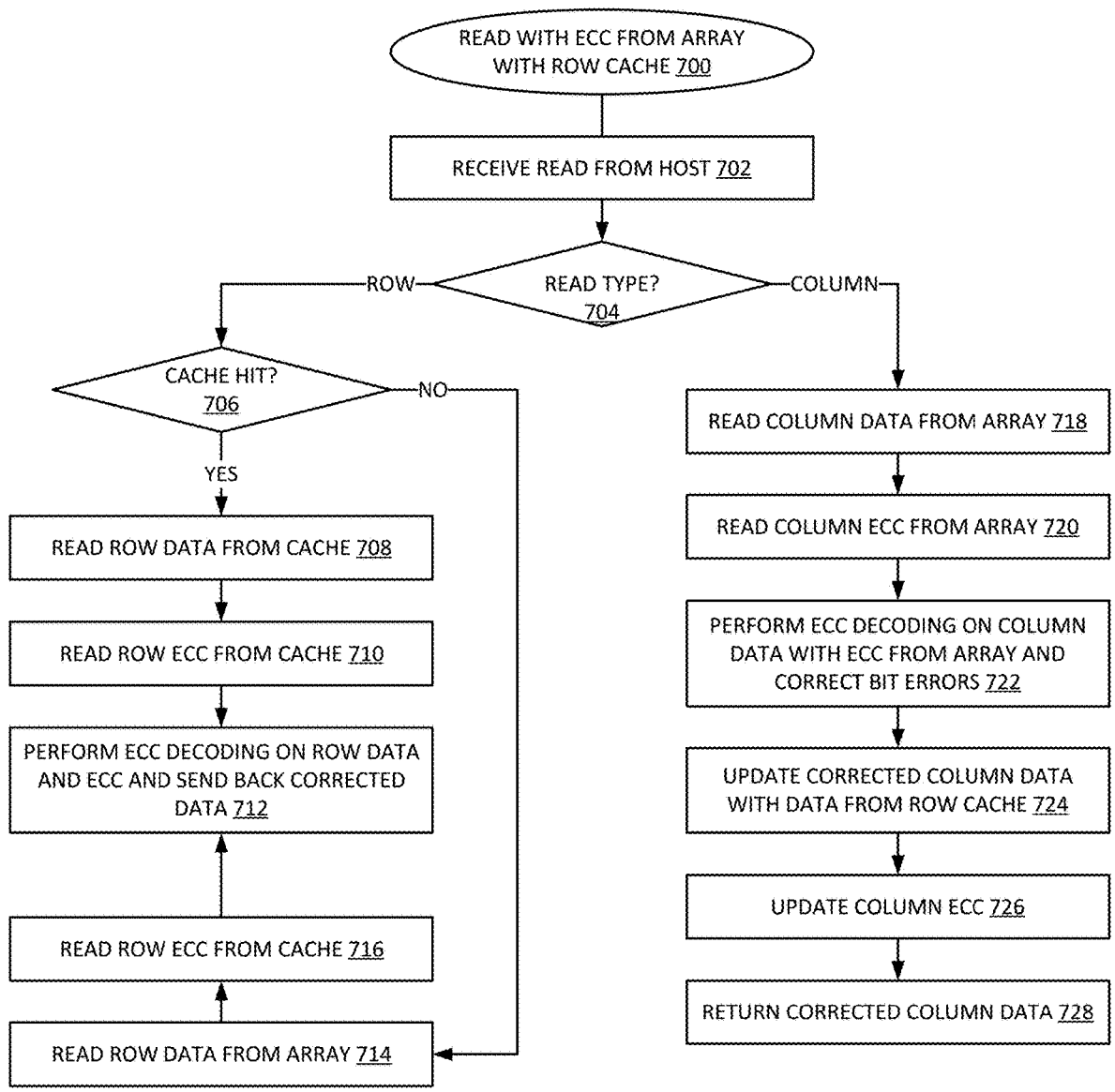
FIG. 7 is a flow diagram of an example of a process for reading from a memory with a row cache and row error correction and column error correction.

FIG. 7 is a flow diagram of an example of a process for reading from a memory with a row cache and row error correction and column error correction. Process 700 for reading data in a system with a row write cache can be implemented by any controller that manages the row write cache.

The host generates a read to the memory device, which can receive the read, at 702. If the read is a row read, at 704 ROW branch, the controller can read the row data from either the array or the cache. If the row read results in a cache hit, at 706 YES branch, in one example, the controller reads the row data from the row data cache, at 708. The controller also reads the row ECC from the cache, at 710. The controller can use the row ECC decoder to correct bit errors in the row data and the row ECC value. Then the controller can send the corrected row data back to the host, at 712.

If the row read does not result in a cache hit, at 706 NO branch, in one example, the controller reads the row data from the array, at 714. The controller reads the row ECC from the cache, at 716. The controller can use the row ECC decoder to correct bit errors in the row data and the row ECC value. Then the controller can send the corrected row data back to the host, at 712.

If the read is a column read, at 704 COLUMN branch, the controller can read the column data from the array, at 718. In one example, the controller reads the column ECC from the array, at 720. The controller can use column ECC decoder to perform ECC decoding to correct bit errors in the column data and the column ECC value, to get the corrected column data, at 722. In one example, the controller updates the corrected column data with data from the row cache, at 724. In one example, the controller can then use the column ECC encoder to update the column ECC based on the updated column data, at 726. The controller can return the corrected column data to the host, at 728.

Figure 8:
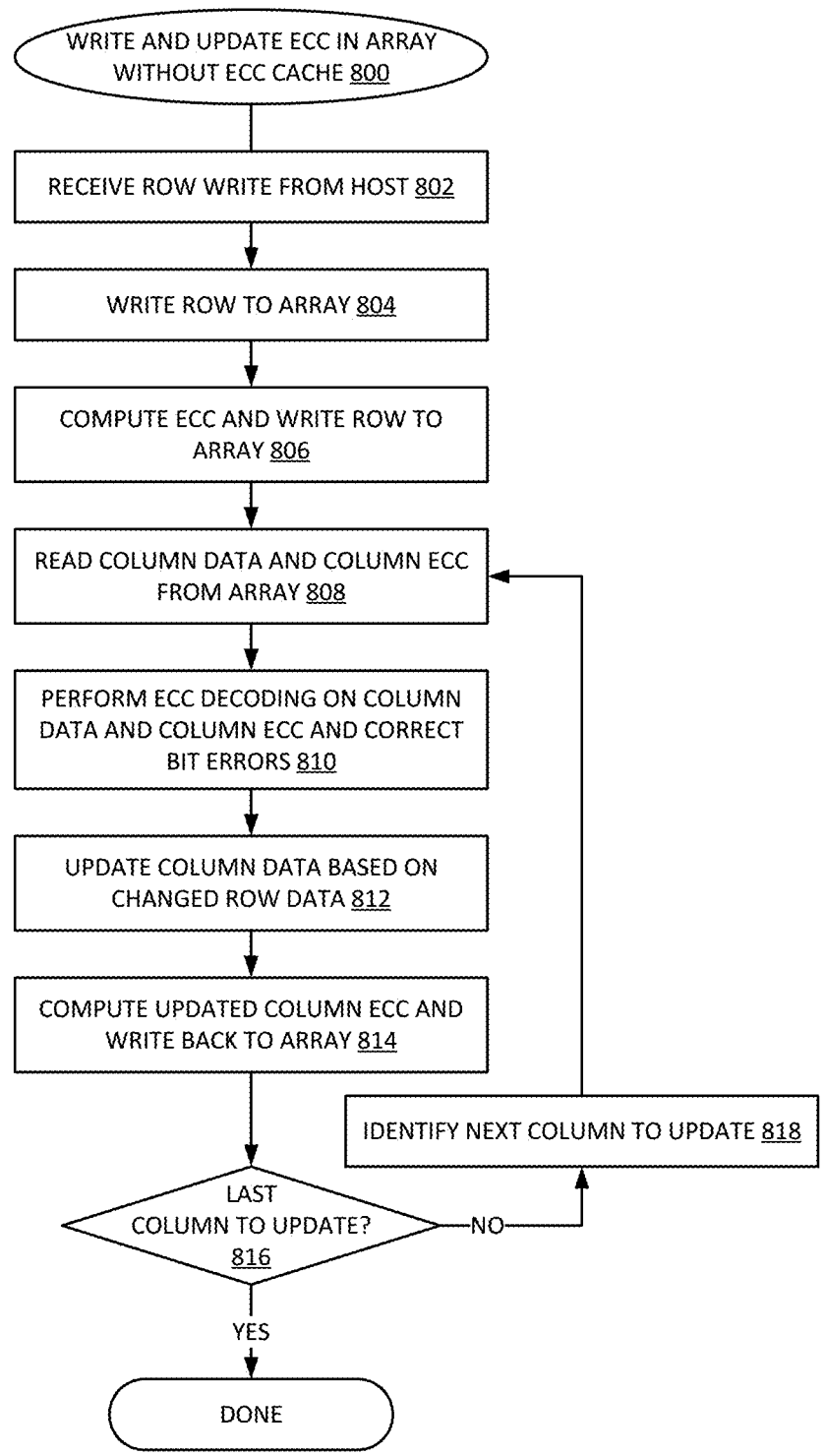
FIG. 8 is a flow diagram of an example of a process for writing to a memory with row error correction and column error correction.

FIG. 8 is a flow diagram of an example of a process for writing to a memory with row error correction and column error correction. Process 800 represents a process for writing and updating ECC in a system with a column ECC and row ECC but no cache for the ECC data.

In one example, the host generates a row write to send to the memory device, at 802. In response to the row write, the memory device can write the row to the memory media, at 804. The updated row ECC can be computed using the row ECC encoder from the row data. The updated row ECC can be written with the row data when the row is written to the array, at 806.

In one example, the controller reads the column data and the column ECC out of the array for a column whose row bit cell changed with the row write, at 808. In one example, the controller uses the column ECC decoder to perform ECC decoding to correct bit errors in the column data, at 810. The controller can update the column data based on the changed row data, at 812. The controller can use the column ECC encoder to compute the updated column ECC based on the updated column data. Then the controller can write the column ECC back to the array, at 814.

If the column whose ECC was updated is not the last column to update, at 816 NO branch, the controller can identify the next column to update, at 818, and repeat the operations to update the column ECC value, at 808. If the column updated is the last column to update, at 816 YES branch, the controller can stop updating the column ECC until the next row write.

Figure 9:
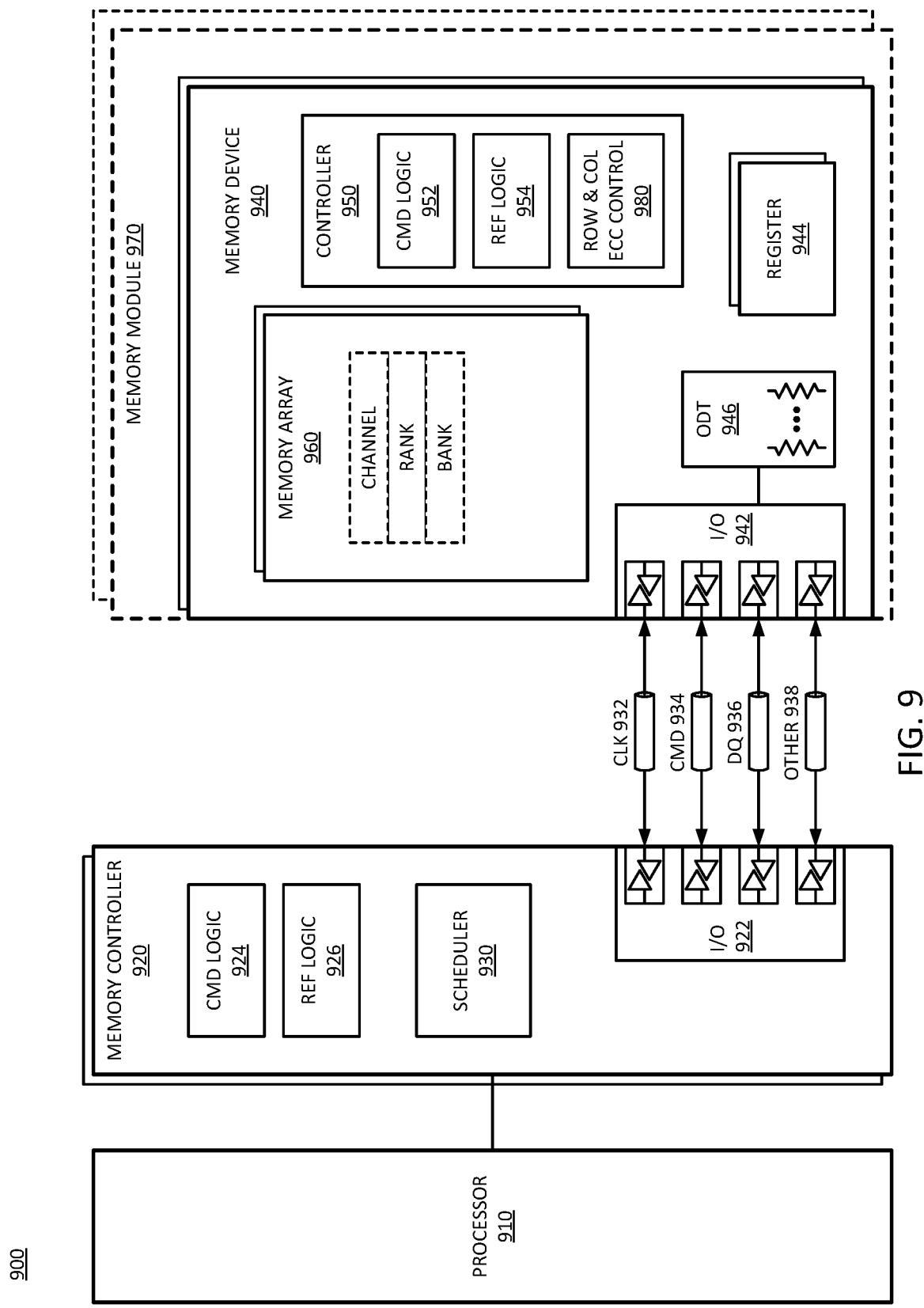
FIG. 9 is a block diagram of an example of a memory subsystem in which a memory device with row error correction and column error correction for dynamic data can be implemented.

FIG. 9 is a block diagram of an example of a memory subsystem in which a memory device with row error correction and column error correction for dynamic data can be implemented. System 900 includes a processor and elements of a memory subsystem in a computing device. System 900 provides an example of a system in accordance with system 100.

In one example, memory array 960 includes row error correction data and column error correction data. In one example, controller 950 includes row & column ECC control 980, referred to as control 980. Control 980 can maintain the row error correction data and column error correction data in accordance with any example described herein. In one example, memory device 940 includes a cache (not specifically shown), which could be a column ECC cache or a row write cache in accordance with any description herein. Control 980 represents control within memory device 940 to maintain error correction in two spatial dimensions, such as with a column ECC cache approach, a row write cache approach, or a column ECC update approach. In one example, control 980 could be in memory controller 920 instead of being in memory device 940.

Processor 910 represents a processing unit of a computing platform that may execute an operating system (OS) and applications, which can collectively be referred to as the host or the user of the memory. The OS and applications execute operations that result in memory accesses. Processor 910 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 900 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (DDR version 4, JESD79-4, originally published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR flash technologies. Thus, a memory device can also include a future generation nonvolatile device, such as a three dimensional crosspoint memory device, other byte addressable nonvolatile memory devices. A memory device can include a nonvolatile, byte addressable media that stores data based on a resistive state of the memory cell, or a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random-access memory (FeTRAM), magnetoresistive random-access memory (MRAM) memory that incorporates memristor technology, or spin transfer torque (STT)-MRAM, or a combination of any of the above, or other memory.

Memory controller 920 represents one or more memory controller circuits or devices for system 900. Memory controller 920 represents control logic that generates memory access commands in response to the execution of operations by processor 910. Memory controller 920 accesses one or more memory devices 940. Memory devices 940 can be DRAM devices in accordance with any referred to above. In one example, memory devices 940 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 920 manages a separate memory channel, although system 900 can be configured to have multiple channels managed by a single controller, or to have multiple controllers on a single channel. In one example, memory controller 920 is part of host processor 910, such as logic implemented on the same die or implemented in the same package space as the processor.

Memory controller 920 includes I/O interface logic 922 to couple to a memory bus, such as a memory channel as referred to above. I/O interface logic 922 (as well as I/O interface logic 942 of memory device 940) can include pins, pads, connectors, signal lines, traces, or wires, or other hardware to connect the devices, or a combination of these. I/O interface logic 922 can include a hardware interface. As illustrated, I/O interface logic 922 includes at least drivers/transceivers for signal lines. Commonly, wires within an integrated circuit interface couple with a pad, pin, or connector to interface signal lines or traces or other wires between devices. I/O interface logic 922 can include drivers, receivers, transceivers, or termination, or other circuitry or combinations of circuitry to exchange signals on the signal lines between the devices. The exchange of signals includes at least one of transmit or receive. While shown as coupling I/O 922 from memory controller 920 to I/O 942 of memory device 940, it will be understood that in an implementation of system 900 where groups of memory devices 940 are accessed in parallel, multiple memory devices can include I/O interfaces to the same interface of memory controller 920. In an implementation of system 900 including one or more memory modules 970, I/O 942 can include interface hardware of the memory module in addition to interface hardware on the memory device itself. Other memory controllers 920 will include separate interfaces to other memory devices 940.

The bus between memory controller 920 and memory devices 940 can be implemented as multiple signal lines coupling memory controller 920 to memory devices 940. The bus may typically include at least clock (CLK) 932, command/address (CMD) 934, and write data (DQ) and read data (DQ) 936, and zero or more other signal lines 938. In one example, a bus or connection between memory controller 920 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 900 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 920 and memory devices 940. An example of a serial bus technology is 8B10B encoding and transmission of high-speed data with embedded clock over a single differential pair of signals in each direction. In one example, CMD 934 represents signal lines shared in parallel with multiple memory devices. In one example, multiple memory devices share encoding command signal lines of CMD 934, and each has a separate chip select (CS_n) signal line to select individual memory devices.

It will be understood that in the example of system 900, the bus between memory controller 920 and memory devices 940 includes a subsidiary command bus CMD 934 and a subsidiary bus to carry the write and read data, DQ 936. In one example, the data bus can include bidirectional lines for read data and for write/command data. In another example, the subsidiary bus DQ 936 can include unidirectional write signal lines for write data from the host to memory, and can include unidirectional lines for read data from the memory to the host. In accordance with the chosen memory technology and system design, other signals 938 may accompany a bus or sub bus, such as strobe lines DQS. Based on design of system 900, or implementation if a design supports multiple implementations, the data bus can have more or less bandwidth per memory device 940. For example, the data bus can support memory devices that have either a x4 interface, a x8 interface, a x16 interface, or other interface. The convention "xW," where W is an integer that refers to an interface size or width of the interface of memory device 940, which represents a number of signal lines to exchange data with memory controller 920. The interface size of the memory devices is a controlling factor on how many memory devices can be used concurrently per channel in system 900 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 940 and memory controller 920 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 940 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 940 represent memory resources for system 900. In one example, each memory device 940 is a separate memory die. In one example, each memory device 940 can interface with multiple (e.g., 2) channels per device or die. Each memory device 940 includes I/O interface logic 942, which has a bandwidth determined by the implementation of the device (e.g., x16 or x8 or some other interface bandwidth). I/O interface logic 942 enables the memory devices to interface with memory controller 920. I/O interface logic 942 can include a hardware interface, and can be in accordance with I/O 922 of memory controller, but at the memory device end. In one example, multiple memory devices 940 are connected in parallel to the same command and data buses. In another example, multiple memory devices 940 are connected in parallel to the same command bus, and are connected to different data buses. For example, system 900 can be configured with multiple memory devices 940 coupled in parallel, with each memory device responding to a command, and accessing memory resources 960 internal to each. For a Write operation, an individual memory device 940 can write a portion of the overall data word, and for a Read operation, an individual memory device 940 can fetch a portion of the overall data word. The remaining bits of the word will be provided or received by other memory devices in parallel.

In one example, memory devices 940 are disposed directly on a motherboard or host system platform (e.g., a PCB (printed circuit board) on which processor 910 is disposed) of a computing device. In one example, memory devices 940 can be organized into memory modules 970. In one example, memory modules 970 represent dual inline memory modules (DIMMs). In one example, memory modules 970 represent other organization of multiple memory devices to share at least a portion of access or control circuitry, which can be a separate circuit, a separate device, or a separate board from the host system platform. Memory modules 970 can include multiple memory devices 940, and the memory modules can include support for multiple separate channels to the included memory devices disposed on them. In another example, memory devices 940 may be incorporated into the same package as memory controller 920, such as by techniques such as multi-chip-module (MCM), package-on-package, through-silicon via (TSV), or other techniques or combinations. Similarly, in one example, multiple memory devices 940 may be incorporated into memory modules 970, which themselves may be incorporated into the same package as memory controller 920. It will be appreciated that for these and other implementations, memory controller 920 may be part of host processor 910.

Memory devices 940 each include one or more memory arrays 960. Memory array 960 represents addressable memory locations or storage locations for data. Typically, memory array 960 is managed as rows of data, accessed via wordline (rows) and bitline (individual bits within a row) control. Memory array 960 can be organized as separate channels, ranks, and banks of memory. Channels may refer to independent control paths to storage locations within memory devices 940. Ranks may refer to common locations across multiple memory devices (e.g., same row addresses within different devices) in parallel. Banks may refer to sub-arrays of memory locations within a memory device 940. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 940 include one or more registers 944. Register 944 represents one or more storage devices or storage locations that provide configuration or settings for the operation of the memory device. In one example, register 944 can provide a storage location for memory device 940 to store data for access by memory controller 920 as part of a control or management operation. In one example, register 944 includes one or more Mode Registers. In one example, register 944 includes one or more multipurpose registers. The configuration of locations within register 944 can configure memory device 940 to operate in different "modes," where command information can trigger different operations within memory device 940 based on the mode. Additionally or in the alternative, different modes can also trigger different operation from address information or other signal lines depending on the mode. Settings of register 944 can indicate configuration for I/O settings (e.g., timing, termination or ODT (on-die termination) 946, driver configuration, or other I/O settings).

In one example, memory device 940 includes ODT 946 as part of the interface hardware associated with I/O 942. ODT 946 can be configured as mentioned above, and provide settings for impedance to be applied to the interface to specified signal lines. In one example, ODT 946 is applied to DQ signal lines. In one example, ODT 946 is applied to command signal lines. In one example, ODT 946 is applied to address signal lines. In one example, ODT 946 can be applied to any combination of the preceding. The ODT settings can be changed based on whether a memory device is a selected target of an access operation or a non-target device. ODT 946 settings can affect the timing and reflections of signaling on the terminated lines. Careful control over ODT 946 can enable higher-speed operation with improved matching of applied impedance and loading. ODT 946 can be applied to specific signal lines of I/O interface 942, 922 (for example, ODT for DQ lines or ODT for CA lines), and is not necessarily applied to all signal lines.

Memory device 940 includes controller 950, which represents control logic within the memory device to control internal operations within the memory device. For example, controller 950 decodes commands sent by memory controller 920 and generates internal operations to execute or satisfy the commands. Controller 950 can be referred to as an internal controller, and is separate from memory controller 920 of the host. Controller 950 can determine what mode is selected based on register 944, and configure the internal execution of operations for access to memory resources 960 or other operations based on the selected mode. Controller 950 generates control signals to control the routing of bits within memory device 940 to provide a proper interface for the selected mode and direct a command to the proper memory locations or addresses. Controller 950 includes command logic 952, which can decode command encoding received on command and address signal lines. Thus, command logic 952 can be or include a command decoder. With command logic 952, memory device can identify commands and generate internal operations to execute requested commands.

Referring again to memory controller 920, memory controller 920 includes command (CMD) logic 924, which represents logic or circuitry to generate commands to send to memory devices 940. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 940, memory controller 920 can issue commands via I/O 922 to cause memory device 940 to execute the commands. In one example, controller 950 of memory device 940 receives and decodes command and address information received via I/O 942 from memory controller 920. Based on the received command and address information, controller 950 can control the timing of operations of the logic and circuitry within memory device 940 to execute the commands. Controller 950 is responsible for compliance with standards or specifications within memory device 940, such as timing and signaling requirements. Memory controller 920 can implement compliance with standards or specifications by access scheduling and control.

Memory controller 920 includes scheduler 930, which represents logic or circuitry to generate and order transactions to send to memory device 940. From one perspective, the primary function of memory controller 920 could be said to schedule memory access and other transactions to memory device 940. Such scheduling can include generating the transactions themselves to implement the requests for data by processor 910 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 920 typically includes logic such as scheduler 930 to allow selection and ordering of transactions to improve performance of system 900. Thus, memory controller 920 can select which of the outstanding transactions should be sent to memory device 940 in which order, which is typically achieved with logic much more complex that a simple first-in first-out algorithm. Memory controller 920 manages the transmission of the transactions to memory device 940, and manages the timing associated with the transaction. In one example, transactions have deterministic timing, which can be managed by memory controller 920 and used in determining how to schedule the transactions with scheduler 930.

In one example, memory controller 920 includes refresh (REF) logic 926. Refresh logic 926 can be used for memory resources that are volatile and need to be refreshed to retain a deterministic state. In one example, refresh logic 926 indicates a location for refresh, and a type of refresh to perform. Refresh logic 926 can trigger self-refresh within memory device 940, or execute external refreshes which can be referred to as auto refresh commands) by sending refresh commands, or a combination. In one example, controller 950 within memory device 940 includes refresh logic 954 to apply refresh within memory device 940. In one example, refresh logic 954 generates internal operations to perform refresh in accordance with an external refresh received from memory controller 920. Refresh logic 954 can determine if a refresh is directed to memory device 940, and what memory resources 960 to refresh in response to the command.

Figure 10:
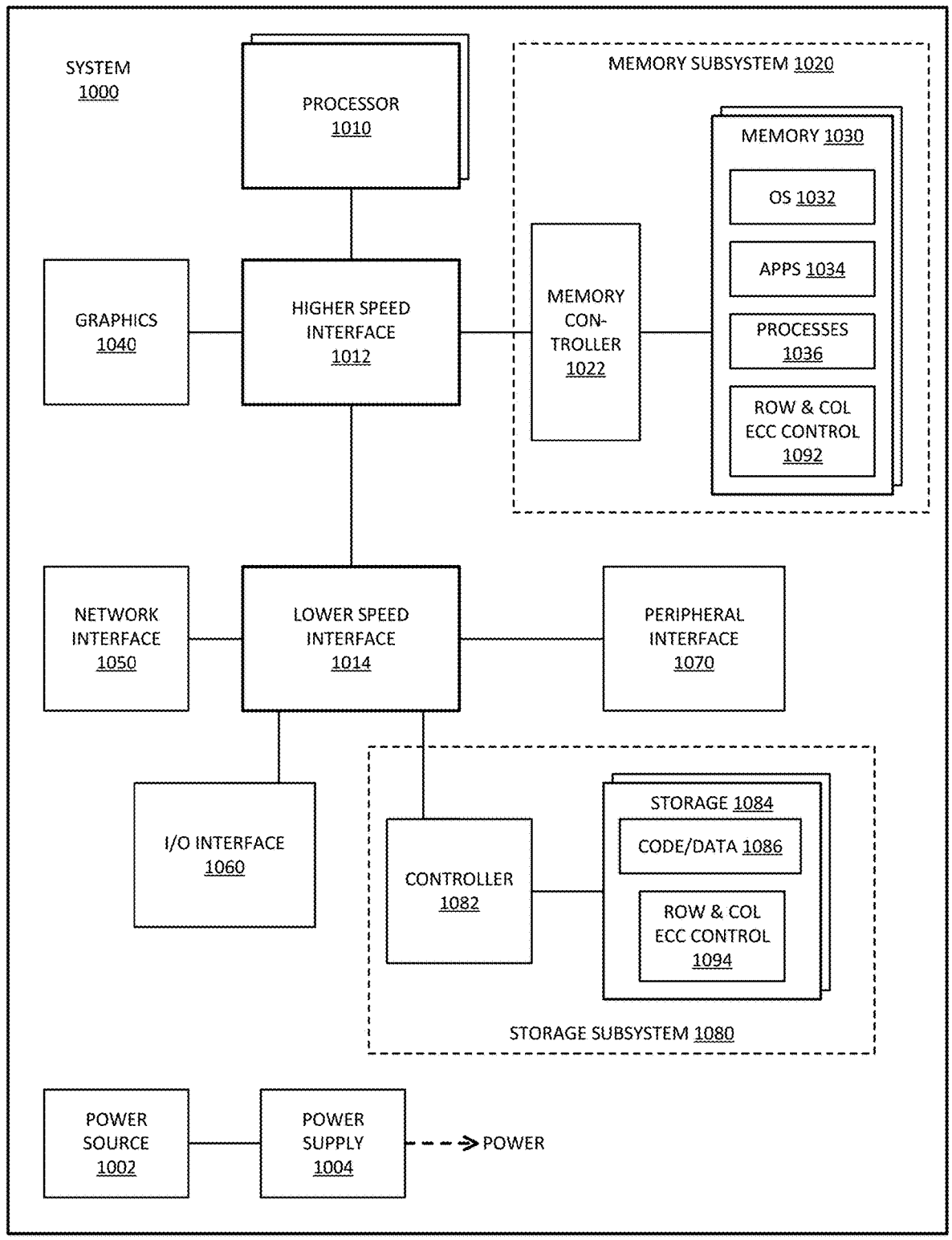
FIG. 10 is a block diagram of an example of a computing system in which a memory device with row error correction and column error correction for dynamic data can be implemented.

FIG. 10 is a block diagram of an example of a computing system in which a memory device with row error correction and column error correction for dynamic data can be implemented. System 1000 represents a computing device in accordance with any example herein, and can be a laptop computer, a desktop computer, a tablet computer, a server, a gaming or entertainment control system, embedded computing device, or other electronic device. System 1000 provides an example of a system in which system 100 can be incorporated.

In one example, memory 1030 includes a memory array with row error correction data and column error correction data. In one example, memory 1030 includes row & column ECC control 1092, referred to as control 1092. Control 1092 can maintain the row error correction data and column error correction data in accordance with any example described herein. In one example, memory device 1030 includes a cache (not specifically shown), which could be a column ECC cache or a row write cache in accordance with any description herein. Control 1092 represents control within memory device 1030 to maintain error correction in two spatial dimensions, such as with a column ECC cache approach, a row write cache approach, or a column ECC update approach. In one example, control 1092 could be in memory controller 1022 instead of being in memory device 1030.

In one example, storage 1084 includes a memory array with row error correction data and column error correction data. In one example, storage 1084 includes row & column ECC control 1094, referred to as control 1094. Control 1094 can maintain the row error correction data and column error correction data in accordance with any example described herein. In one example, storage 1084 includes a cache (not specifically shown), which could be a column ECC cache or a row write cache in accordance with any description herein. Control 1094 represents control within storage 1084 to maintain error correction in two spatial dimensions, such as with a column ECC cache approach, a row write cache approach, or a column ECC update approach. In one example, control 1094 could be in memory controller 1022 instead of being in storage 1084.

System 1000 includes processor 1010 can include any type of microprocessor, central processing unit (CPU), graphics processing unit (GPU), processing core, or other processing hardware, or a combination, to provide processing or execution of instructions for system 1000. Processor 1010 can be a host processor device. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1000 includes interface 1012 coupled to processor 1010, which can represent a higher speed interface or a high throughput interface for system components that need higher bandwidth connections, such as memory subsystem 1020 or graphics interface components 1040. Interface 1012 represents an interface circuit, which can be a standalone component or integrated onto a processor die. Interface 1012 can be integrated as a circuit onto the processor die or integrated as a component on a system on a chip. Where present, graphics interface 1040 interfaces to graphics components for providing a visual display to a user of system 1000. Graphics interface 1040 can be a standalone component or integrated onto the processor die or system on a chip. In one example, graphics interface 1040 can drive a high definition (HD) display or ultra high definition (UHD) display that provides an output to a user. In one example, the display can include a touchscreen display. In one example, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more memory devices 1030 such as read-only memory (ROM), flash memory, one or more varieties of random-access memory (RAM) such as DRAM, 3DXP (three-dimensional crosspoint), or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010, such as integrated onto the processor die or a system on a chip.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1000 includes interface 1014, which can be coupled to interface 1012. Interface 1014 can be a lower speed interface than interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, 3DXP, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1000 to provide power to the components of system 1000. In one example, power supply 1004 includes an AC to DC (alternating current to direct current) adapter to plug into a wall outlet. Such AC power can be renewable energy (e.g., solar power) power source 1002. In one example, power source 1002 includes a DC power source, such as an external AC to DC converter. In one example, power source 1002 or power supply 1004 includes wireless charging hardware to charge via proximity to a charging field. In one example, power source 1002 can include an internal battery or fuel cell source.

Figure 11:
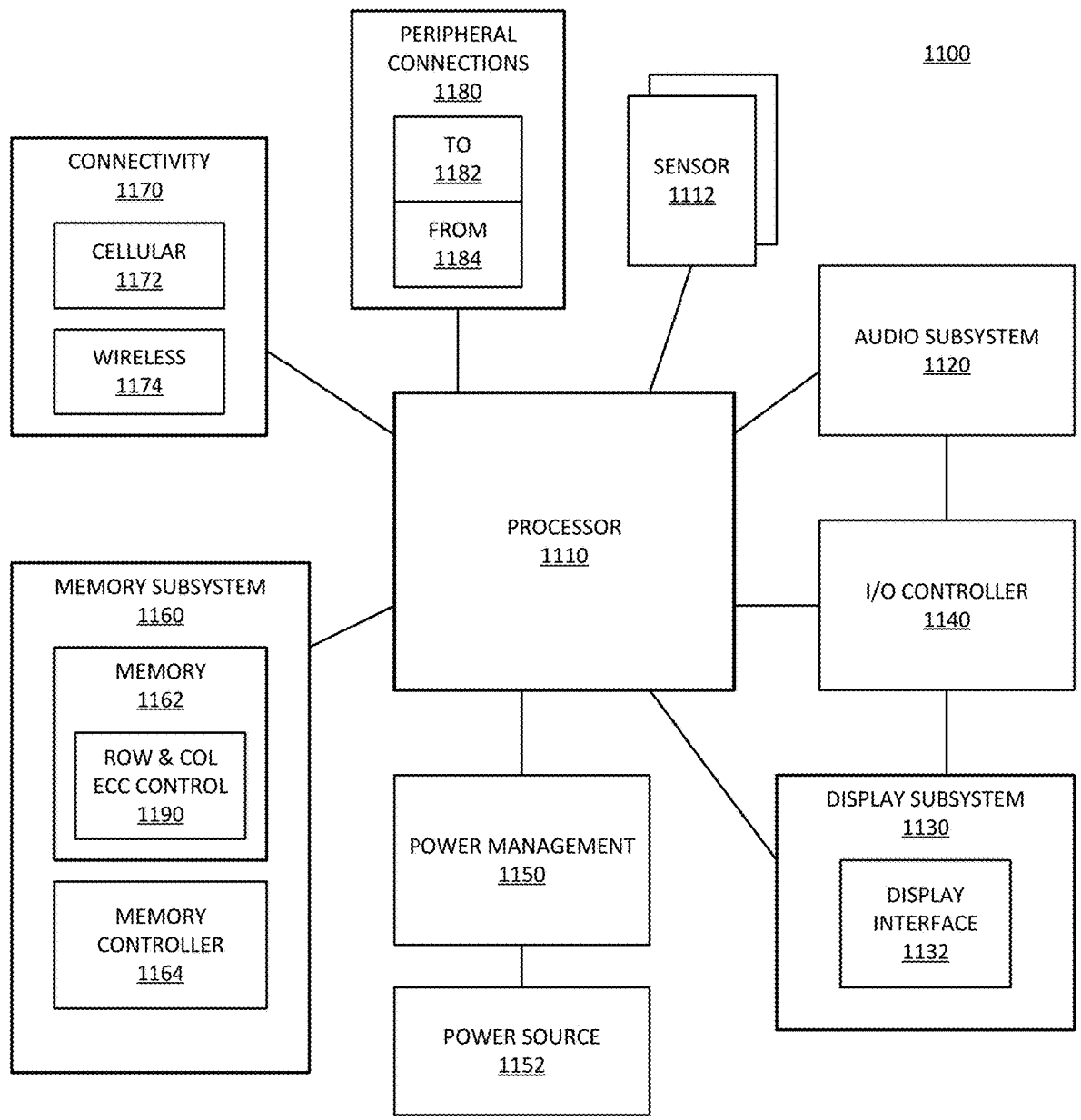
FIG. 11 is a block diagram of an example of a mobile device in which a memory device with row error correction and column error correction for dynamic data can be implemented.

FIG. 11 is a block diagram of an example of a mobile device in which a memory device with row error correction and column error correction for dynamic data can be implemented. System 1100 represents a mobile computing device, such as a computing tablet, a mobile phone or smartphone, wearable computing device, or other mobile device, or an embedded computing device. It will be understood that certain of the components are shown generally, and not all components of such a device are shown in system 1100. System 1100 provides an example of a system in which system 100 can be incorporated.

In one example, memory 1162 is a nonvolatile memory device. In one example, memory 1162 is a volatile memory device. Memory 1162 includes a memory array with row error correction data and column error correction data. In one example, memory 1162 includes row & column ECC control 1190, referred to as control 1190. Control 1190 can maintain the row error correction data and column error correction data in accordance with any example described herein. In one example, memory 1162 includes a cache (not specifically shown), which could be a column ECC cache or a row write cache in accordance with any description herein. Control 1190 represents control within memory 1162 to maintain error correction in two spatial dimensions, such as with a column ECC cache approach, a row write cache approach, or a column ECC update approach. In one example, control 1190 could be in memory controller 1164 instead of being in memory 1162.

System 1100 includes processor 1110, which performs the primary processing operations of system 1100. Processor 1110 can be a host processor device. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting system 1100 to another device, or a combination. The processing operations can also include operations related to audio I/O, display I/O, or other interfacing, or a combination. Processor 1110 can execute data stored in memory. Processor 1110 can write or edit data stored in memory.

In one example, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one example, one or more sensors 1112 couples to processor 1110 via a frontend circuit integrated with processor 1110. In one example, one or more sensors 1112 couples to processor 1110 via another component of system 1100.

In one example, system 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1100, or connected to system 1100. In one example, a user interacts with system 1100 by providing audio commands that are received and processed by processor 1110.

Display subsystem 1130 represents hardware (e.g., display devices) and software components (e.g., drivers) that provide a visual display for presentation to a user. In one example, the display includes tactile components or touchscreen elements for a user to interact with the computing device. Display subsystem 1130 includes display interface 1132, which includes the particular screen or hardware device used to provide a display to a user. In one example, display interface 1132 includes logic separate from processor 1110 (such as a graphics processor) to perform at least some processing related to the display. In one example, display subsystem 1130 includes a touchscreen device that provides both output and input to a user. In one example, display subsystem 1130 includes a high definition (HD) or ultra-high definition (UHD) display that provides an output to a user. In one example, display subsystem includes or drives a touchscreen display. In one example, display subsystem 1130 generates display information based on data stored in memory or based on operations executed by processor 1110 or both.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to system 1100 through which a user might interact with the system. For example, devices that can be attached to system 1100 might include microphone devices, speaker or stereo systems, video systems or other display device, keyboard or keypad devices, buttons/switches, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of system 1100. Additionally, audio output can be provided instead of or in addition to display output. In another example, if display subsystem includes a touchscreen, the display device also acts as an input device, which can be at least partially managed by I/O controller 1140. There can also be additional buttons or switches on system 1100 to provide I/O functions managed by I/O controller 1140.

In one example, I/O controller 1140 manages devices such as accelerometers, cameras, light sensors or other environmental sensors, gyroscopes, global positioning system (GPS), or other hardware that can be included in system 1100, or sensors 1112. The input can be part of direct user interaction, as well as providing environmental input to the system to influence its operations (such as filtering for noise, adjusting displays for brightness detection, applying a flash for a camera, or other features).

In one example, system 1100 includes power management 1150 that manages battery power usage, charging of the battery, and features related to power saving operation. Power management 1150 manages power from power source 1152, which provides power to the components of system 1100. In one example, power source 1152 includes an AC to DC (alternating current to direct current) adapter to plug into a wall outlet. Such AC power can be renewable energy (e.g., solar power, motion based power). In one example, power source 1152 includes only DC power, which can be provided by a DC power source, such as an external AC to DC converter. In one example, power source 1152 includes wireless charging hardware to charge via proximity to a charging field. In one example, power source 1152 can include an internal battery or fuel cell source.

Memory subsystem 1160 includes memory device(s) 1162 for storing information in system 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one example, memory subsystem 1160 includes memory controller 1164 (which could also be considered part of the control of system 1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable system 1100 to communicate with external devices. The external device could be separate devices, such as other computing devices, wireless access points or base stations, as well as peripherals such as headsets, printers, or other devices. In one example, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, system 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that system 1100 could both be a peripheral device ("to" 1182) to other computing devices, as well as have peripheral devices ("from" 1184) connected to it. System 1100 commonly has a "docking" connector to connect to other computing devices for purposes such as managing (e.g., downloading, uploading, changing, synchronizing) content on system 1100. Additionally, a docking connector can allow system 1100 to connect to certain peripherals that allow system 1100 to control content output, for example, to audiovisual or other systems.

In addition to a proprietary docking connector or other proprietary connection hardware, system 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a memory device includes: a memory array addressable in two spatial dimensions, including a row dimension and a column dimension, the memory array including bit cells that can be read as rows in the row dimension or read as columns in the column dimension; and a controller to generate and store ECC (error checking and correction) values for the memory array, including row ECC values for the rows of the memory array and column ECC values for the columns of the memory array; wherein, in response to a data write to a selected row of the memory array, the controller is to update a row ECC value for the selected row and to update one or more column ECC values.

In one example, the memory device further includes a cache to store one or more updated ECC values in response to the data write. In one example, the cache comprises a column ECC cache to store column ECC values, wherein the controller is to store in the column ECC cache column ECC values updated in response to the data write. In one example, in response to a read request for a selected column in the column dimension, the controller is to read a column ECC value for the selected column from the column ECC cache instead of from the memory array. In one example, in response to the data write, the controller is to read one or more column ECC values from the memory array, update the one or more column ECC values consistent with the data write, and write the updated column ECC values to the column ECC cache. In one example, the controller is to update multiple column ECC values in parallel in a single operation. In one example, the cache comprises a row cache to store recent row writes. In one example, the row cache includes a number of rows less than a number of bits of column ECC in a single column ECC value. In one example, in response to a read request in the row dimension for a selected row in the write cache, the controller is to read a row ECC value for the selected row from the row cache. In one example, in response to a read request in the column dimension for a selected column, the controller is to read the selected column from the memory array, perform ECC on the selected column with a corresponding column ECC value from the memory array, and update the selected column based on rows stored in the row cache. In one example, the cache comprises a power fail-safe memory having an energy store to flush to the memory array in response to detection of a power failure. In one example, the controller is to update only column ECC values for columns whose bit cell changed in response to the data write. In one example, for a workload having data writes in the row dimension with a number of bit cells in the single digits being changed in the row, the controller is to write the row and the row ECC value to the memory array, and to update the column ECC value for each column having a bit cell changed in the row. In one example, the controller is to identify changed columns during a read-modify-write operation to perform the data write. In one example, the controller is to transpose and store column ECC values as rows of column ECC values. In one example, the memory array comprises an array of three-dimensional crosspoint bit cells.

In general with respect to the descriptions herein, in one example a system includes: a host controller; and a nonvolatile memory device, including a three-dimensional crosspoint (3DXP) memory array addressable in two spatial dimensions, including a row dimension and a column dimension, the memory array including bit cells that can be read as rows in the row dimension or read as columns in the column dimension; and an access controller to generate and store ECC (error checking and correction) values for the memory array, including row ECC values for the rows of the memory array and column ECC values for the columns of the memory array; wherein, in response to a data write to a selected row of the memory array, the access controller is to update a row ECC value for the selected row and to update one or more column ECC values.

In one example, the nonvolatile memory device further includes a column ECC cache to store column ECC values, wherein the access controller is to store in the column ECC cache column ECC values updated in response to the data write. In one example, the nonvolatile memory device further includes a row cache to store recent row writes; wherein in response to a read request in the row dimension for a selected row in the write cache, the access controller is to read a row ECC value for the selected row from the row cache; and wherein in response to a read request in the column dimension for a selected column, the access controller is to read the selected column from the memory array, perform ECC corrections on the selected column with a corresponding column ECC value from the memory array, and update the selected column based on rows stored in the row cache. In one example, the system further includes one or more of: a host processor device coupled to the host controller; a display communicatively coupled to a host processor; a network interface communicatively coupled to a host processor; or a battery to power the system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random-access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
a memory array addressable in two spatial dimensions, including a row dimension and a column dimension, the memory array including bit cells that can be read as rows in the row dimension or read as columns in the column dimension, where a row of bits cells stores a row-oriented codeword and a row ECC (error checking and correction) value for the row-oriented codeword, and a column of bit cells stores a column-oriented codeword and a column ECC value for the column-oriented codeword;
a controller configured to generate and store in the memory array, row ECC values for the rows of the memory array and column ECC values for the columns of the memory array, and in response to a data write to a selected row of the memory array, the controller is configured to update a row ECC value for the selected row and to update one or more column ECC values; and
a cache to store one or more updated ECC values in response to the data write, the cache including a column ECC cache to store column ECC values;
wherein the controller is configured to store in the column ECC cache column ECC values updated in response to the data write, and in response to a read request for a selected column in the column dimension, read a column ECC value for the selected column from the column ECC cache instead of from the memory array.

2. The memory device of claim 1, wherein in response to the data write, the controller is configured to read one or more column ECC values from the memory array, update the one or more column ECC values consistent with the data write, and write the updated column ECC values to the column ECC cache.

3. The memory device of claim 1, wherein the controller is configured to update multiple column ECC values in parallel in a single operation.

4. The memory device of claim 1, wherein the cache comprises a row cache to store recent row writes.

5. The memory device of claim 4, wherein the row cache includes a number of rows less than a number of bits of column ECC in a single column ECC value.

6. The memory device of claim 4, wherein in response to a read request in the row dimension for a selected row in the row cache, the controller is configured to read a row ECC value for the selected row from the row cache.

7. The memory device of claim 4, wherein in response to a read request in the column dimension for a selected column, the controller is configured to read the selected column from the memory array, perform ECC on the selected column with a corresponding column ECC value from the memory array, and update the selected column based on rows stored in the row cache.

8. The memory device of claim 1, wherein the cache comprises a power fail-safe memory having an energy store to flush to the memory array in response to detection of a power failure.

9. The memory device of claim 1, wherein the controller is configured to update only column ECC values for columns whose bit cell changed in response to the data write.

10. The memory device of claim 9, wherein for a workload having data writes in the row dimension with a single digit number of bit cells being changed in the row, the controller is configured to write the row and the row ECC value to the memory array, and to update the column ECC value for each column having a bit cell changed in the row.

11. The memory device of claim 9, wherein the controller is configured to identify changed columns during a read-modify-write operation to perform the data write.

12. The memory device of claim 1, wherein the controller is configured to transpose and store column ECC values as rows of column ECC values.

13. The memory device of claim 1, wherein the memory array comprises an array of three-dimensional crosspoint bit cells.

14. A system, comprising:
a host controller; and
a nonvolatile memory device, including
a three-dimensional crosspoint (3DXP)-memory array addressable in two spatial dimensions, including a row dimension and a column dimension, the memory array including bit cells that can be read as rows in the row dimension or read as columns in the column dimension, where a row of bits cells stores a row-oriented codeword and a row ECC (error checking and correction) value for the row-oriented codeword, and a column of bit cells stores a column-oriented codeword and a column ECC value for the column-oriented codeword;
an access controller configured to generate and store in the memory array, row ECC values for the rows of the memory array and column ECC values for the columns of the memory array, and in response to a data write to a selected row of the memory array, the access controller is configured to update a row ECC value for the selected row and to update one or more column ECC values; and
a cache to store one or more updated ECC values in response to the data write, the cache including a column ECC cache to store column ECC values;
wherein the access controller is configured to store in the column ECC cache column ECC values updated in response to the data write, and in response to a read request for a selected column in the column dimension, read a column ECC value for the selected column from the column ECC cache instead of from the memory array.

15. The system of claim 14, wherein the nonvolatile memory device further includes a column ECC cache to store column ECC values, wherein the access controller is configured to store in the column ECC cache column ECC values updated in response to the data write.

16. The system of claim 14, wherein the nonvolatile memory device further includes a row cache to store recent row writes;
wherein in response to a read request in the row dimension for a selected row in the row cache, the access controller is configured to read a row ECC value for the selected row from the row cache; and
wherein in response to a read request in the column dimension for a selected column, the access controller is configured to read the selected column from the memory array, perform ECC corrections on the selected column with a corresponding column ECC value from the memory array, and update the selected column based on rows stored in the row cache.

17. The system of claim 14, further comprising one or more of:
a host processor device coupled to the host controller;

a display communicatively coupled to a host processor;
a network interface communicatively coupled to a host processor; or
a battery to power the system.

* * * * *